United States Patent [19]

Jeerings et al.

[11] Patent Number: 4,871,971

[45] Date of Patent: Oct. 3, 1989

[54] HIGH IMPEDANCE FAULT ANALYZER IN ELECTRIC POWER DISTRIBUTION NETWORKS

[76] Inventors: Donald I. Jeerings, 2715 Cypress Dr., Clearwater, Fla. 33575; John R. Linders, 5747 Isanda Pl., Sarasota, Fla. 33581

[21] Appl. No.: 142,582

[22] Filed: Jan. 11, 1988

Related U.S. Application Data

[63] Continuation-in-part of Ser. No. 3,585, Jan. 15, 1987.

[51] Int. Cl.$^4$ .................. G01R 31/08; G01R 31/02; H02H 3/38
[52] U.S. Cl. .................. 324/509; 324/521; 324/522; 324/539; 361/47; 361/65; 361/79
[58] Field of Search ............ 324/508, 509, 512, 520, 324/521, 522, 537, 539, 541, 86, 107, 108, 127, 128, 78 R; 361/47, 48, 65, 76, 85, 87, 79; 340/870.26, 658, 661, 664; 364/495, 483, 731

[56] References Cited

U.S. PATENT DOCUMENTS 4,313,146 1/1982 Lee .................. 324/107 X

FOREIGN PATENT DOCUMENTS 0873239 10/1981 U.S.S.R. .................. 367/731

Primary Examiner—Reinhard J. Eisenzopf
Assistant Examiner—Jack B. Harvey
Attorney, Agent, or Firm—Cleveland, OH 44114; Watts, Hoffmann, Fisher & Heinke Co.

[57] ABSTRACT

A system and method is disclosed for detecting an abnormality in a network for distributing or transmitting electric power at a predetermined fundamental frequency. The system produces a signal representing the fundamental frequency and another signal representing a harmonic current occurring in the network. The phasor relation between the fundamental voltage and harmonic current representing signal are compared. The system produces a signal indicating the occurrence of a high impedance fault in response to a predetermined change in the compared phasor relationship. Embodiments are disclosed utilizing expression of signals within the network in polar coordinates, as well as embodiments utilizing signals expressed in rectangular coordinates. Such embodiments include circuitry for detecting zero crossing phenomena, as well as circuitry for producing representation of signal products.

24 Claims, 11 Drawing Sheets

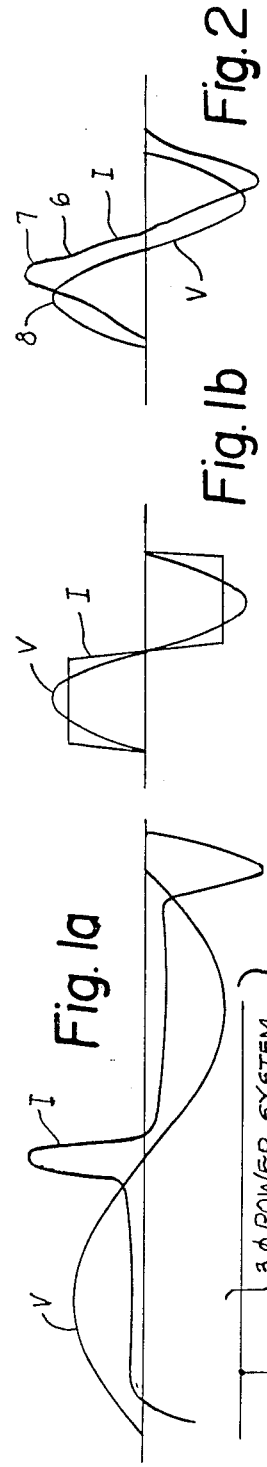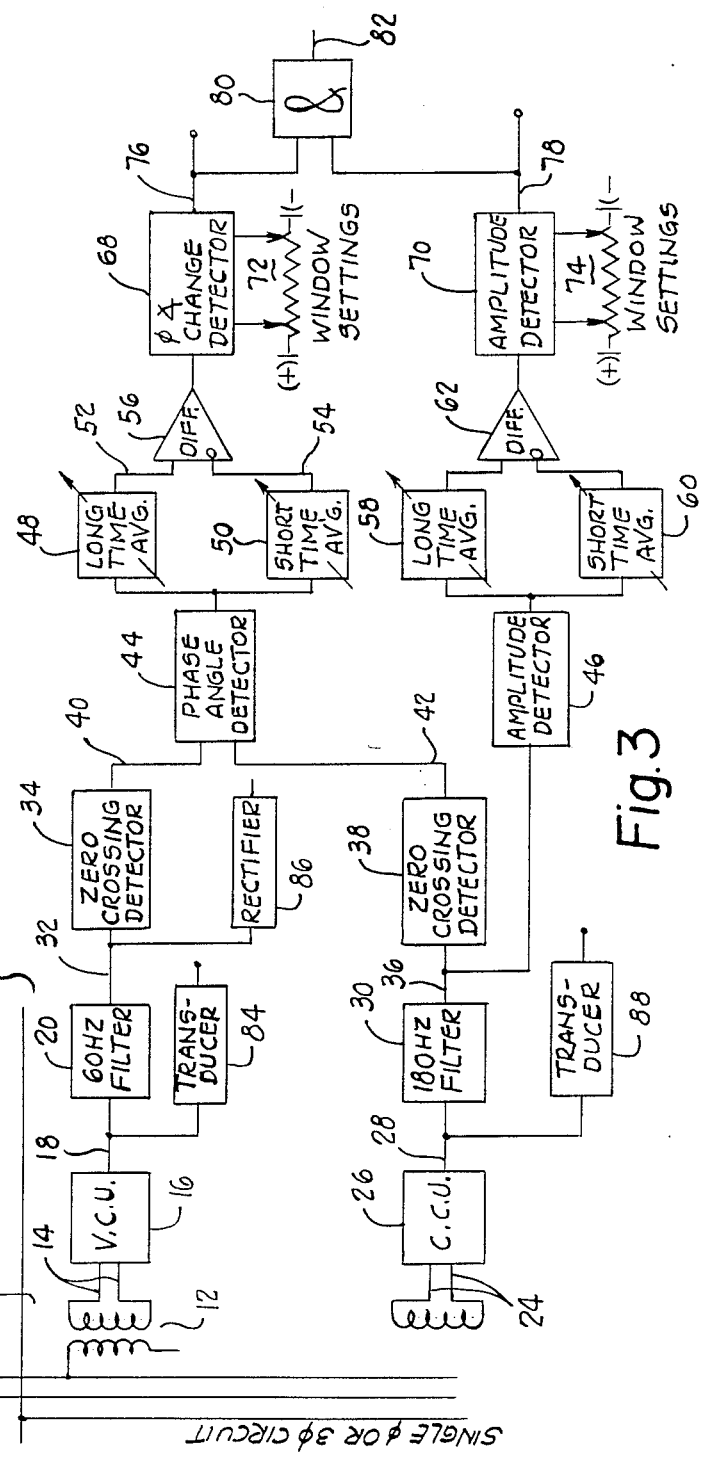

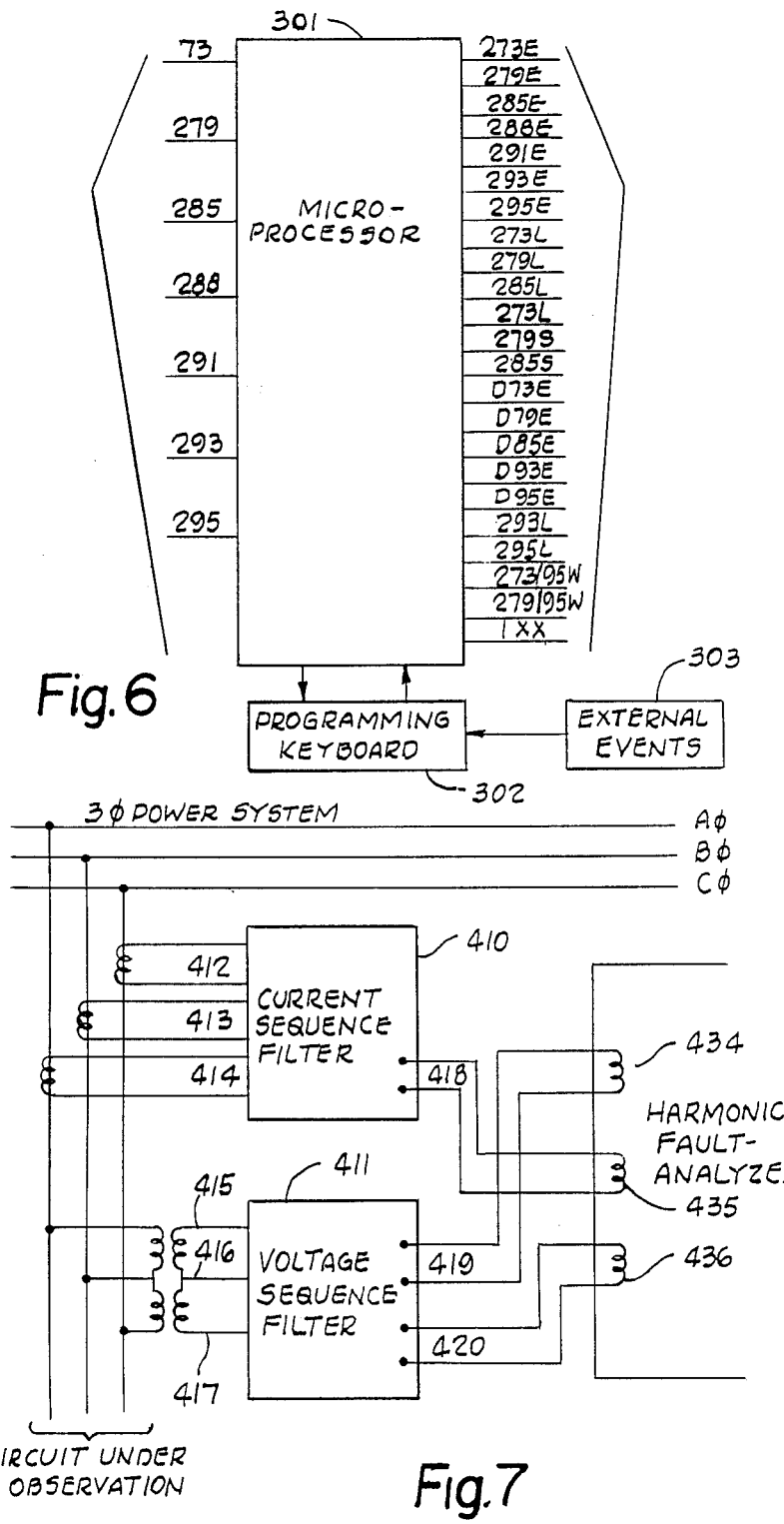

$$PH = [(I\sin a - I'\sin a')^2 + (I\cos a - I'\cos A)]$$

$$d = TAN^{-1}[I\sin a - I'\sin a')(I\cos a - I'\cos a)$$

```
POLARITY OF X    +  -  -  +
POLARITY OF Y    +  +  -  -
QUADRANT         1  2  3  4
```

HIGH IMPEDANCE FAULT ANALYZER IN ELECTRIC POWER DISTRIBUTION NETWORKS

This application is a continuation-in-part of U.S. States patent application Ser. No. 003,585, filed Jan. 15, 1987.

DESCRIPTION

1. Technical Field

The present invention pertains to an analyzer system for detecting high impedance faults and other abnormalities in electric power transmission and distribution networks distinct from normal, non-fault changes in system load and conditions.

2. Background Art

In the operation of an electric power transmission and distribution system, it is possible that abnormal and possibly dangerous conditions may arise which are not readily detectable by any practical monitoring system available today. One such condition is that of an energized high voltage conductor lying on a pavement or upon dry earth. This could result from the breakage of a utility pole, which normally carries the energized wire beyond reach of a person. Such condition could arise by the pole being broken or downed by a vehicle or by severe weather. Sometimes, a conductor splice connecting two energized conductors together might fail, allowing one or both of the conductor ends to fall upon dry ground or upon pavement.

Frequently, in such cases, the amount of fault current passing from the energized wire to ground is quite limited due to the high impedance in the ground return path. Conventional means for detecting down wires and the like include known types of short circuit detection equipment, such as current monitoring, circuit breakers, fuses and the like. Such conventional means are often not sufficiently sensitive to detect the small fault current resulting from a high impedance fault.

In such cases, the high impedance fault current may be only a few percent of the normal load current, and thus is not likely to be recognized by protective devices commonly used in electric power distribution systems, such as protective relays, circuit breakers or fuses. A most difficult down conductor condition to recognize is that in which the conductor breaks and lies on a dry asphalt pavement, and there is substantially no fault current at all.

It is known that a high impedance fault in an electric power distribution system is often the result of either an unstable arc, or of an arc of substantial length, or is the result of a high resistance, dry earth ground return fault path. In any of these cases, the high impedance which limits the fault current will be generally nonlinear during the voltage excursion of the distribution system during each half cycle. It is known that this results in a distorted system current wave which, upon analysis, can be shown to contain harmonic frequencies as well as the fundamental frequency component of the electric power distribution system.

It has been proposed to simply measure these harmonic currents on the electric power distribution system. Such an approach, however, is not generally sufficient to identify positively the existence of such a fault condition. One reason for this is that, on a typical commercial electric power transmission and distribution network, the sources of harmonics are continually changing, and thus the harmonics normally present on the system are changing as well.

Among the sources of harmonics normally occurring in the system are the many transformers and electric motors connected to the system, ballast type lamps, arc furnaces, rectifiers, thyristor controlled loads, television sets and other energized nonlinear devices. Harmonic sinks include all the components connected to the system, including even some of those components which are themselves harmonic sources.

Variations in both the sources and the sinks, or absorbers, of normally occurring harmonics on the power distribution system, can mask harmonics which may arise in response to the occurrence of a high impedance fault or other abnormality.

A characteristic common to many of these harmonic sources is that they are nonlinear inductances, or that they, by their nature, require an inductive current, such as in the case of the electric arc furnaces mentioned above.

The exciting current of a typical transformer, illustrated in the waveform of FIG. 1A illustrates that some of these distorted currents tend to peak when the voltage is near its zero value. A distorted, flattop current wave similar to the square wave illustrated in FIG. 1b is drawn by a single phase thyristor controlled motor load.

It is an object of this invention to provide a system for analyzing conditions on an electric power system to detect the occurrence of high impedance faults on the system, without producing spurious indications in response to normal, non-fault changes in the system characteristics which result from normal changes in system load and conditions.

DISCLOSURE OF THE INVENTION

The disadvantages and shortcomings of the prior art are overcome or substantially eliminated by the use of a system and method for detecting an abnormality in a network for distributing alternating current electric power at a fundamental frequency. The method includes producing a signal representing the fundamental frequency of a voltage occurring in the network, and producing another signal representing a harmonic of a current occurring in the network. The phase relationship between the fundamental voltage and harmonic current representing signals are compared. A signal indicating the occurrence of a high impedance fault is produced in response to a predetermined change in the compared phase relationships between the fundamental voltage signal and the harmonic current signal.

In accordance with a more specific embodiment, the phase relation between the fundamental voltage and harmonic current signal is monitored by two parallel averaging circuits. One averaging circuit, averaging over a relatively long time, produces a signal which corresponds generally to the ambient system phase relation between the fundamental voltage and harmonic current signals. The other averaging circuit averages over a significantly shorter time, and produces a signal which corresponds generally to the present value of the phase relation between the fundamental voltage and harmonic current signals.

The difference between these long term and short term averaged phase difference signals is what is detected in this embodiment to indicate the occurrence of a high impedance fault. The long term averaged signal is preferably established at approximately 10 seconds to 10 minutes in order to average over a time period which, while long enough to establish an ambient system condition, is still short enough to follow normal system hour to hour load and condition changes. The short term averaged signal, in the preferred embodiment, is averaged over a period of approximately one tenth to five seconds, in order to be long enough to avoid spurious response to normal transients which occur in the system.

In accordance with a more specific aspect, the amplitude of the current harmonic signal is also monitored and averaged as described above in connection with the phase angle signals. When a change occurs in the short term averaged current harmonic amplitude signal, with respect to the long term averaged current harmonic amplitude signal, that input is, in a preferred embodiment also used, in combination with the phase angle change signal described above, to indicate the occurrence of a high impedance fault in the system.

In another embodiment, both a voltage harmonic signal and a current harmonic signal, preferably the same harmonic, are monitored, and their respective phase angles are compared. This comparison is analogous to the manner of comparison of the harmonic current to the fundamental voltage signals described above. Additionally, the amplitude of the harmonic voltage signal can also be sensed, and averaged and change-detected, analogous to the manner in which the current harmonic amplitude signal is processed as described above.

In accordance with a more specific aspect, a further output is obtained by ratioing the harmonic voltage change signal with the harmonic current change signal.

In this more specific embodiment, these various outputs thus obtained are combined through logic gating in specified manners to obtain accurate and positive indications of the occurrence of high impedance faults and abnormalities in the electric power distribution system, while discriminating against spurious indications which would otherwise arise in response to the occurrence of normal, non-fault changes in harmonic sources, sinks, transients and other system conditions.

In accordance with a specific embodiment of the present invention, phase relationships between signals in various parts of the network are determined by analysis in rectangular coordinates, rather than by polar coordinate analysis. In such embodiments means such as diode bridges are employed to develop product representing signals which are functions of trigonometric functions of phase angle differences, rather than functions of the phase angles themselves.

The specific embodiment of the present invention will be further understood by reference to the following detailed description, and to the drawings, in which:

BRIEF DESCRIPTION OF THE DRAWINGS

FIGS. 1A, 1B and 2 illustrate certain distorted current waveforms which arise under various electric power distribution system operating conditions, including high impedance faults;

FIG. 3 a block diagram illustrating an embodiment of a high impedance fault analyzer for detecting faults on an electric power distribution system;

FIGS. 5 and 6 are schematic and block diagrams, respectively, of another embodiment illustrating in detail the feasibility of utilizing a combination of both analog and digital means to attain the desired results;

FIG. 7 is a block diagram illustrating adaptation of fault analyzer systems such as illustrated in FIGS. 3-6 to polyphase electrical power distribution systems;

BEST MODE FOR CARRYING OUT THE INVENTION

Figure 4:
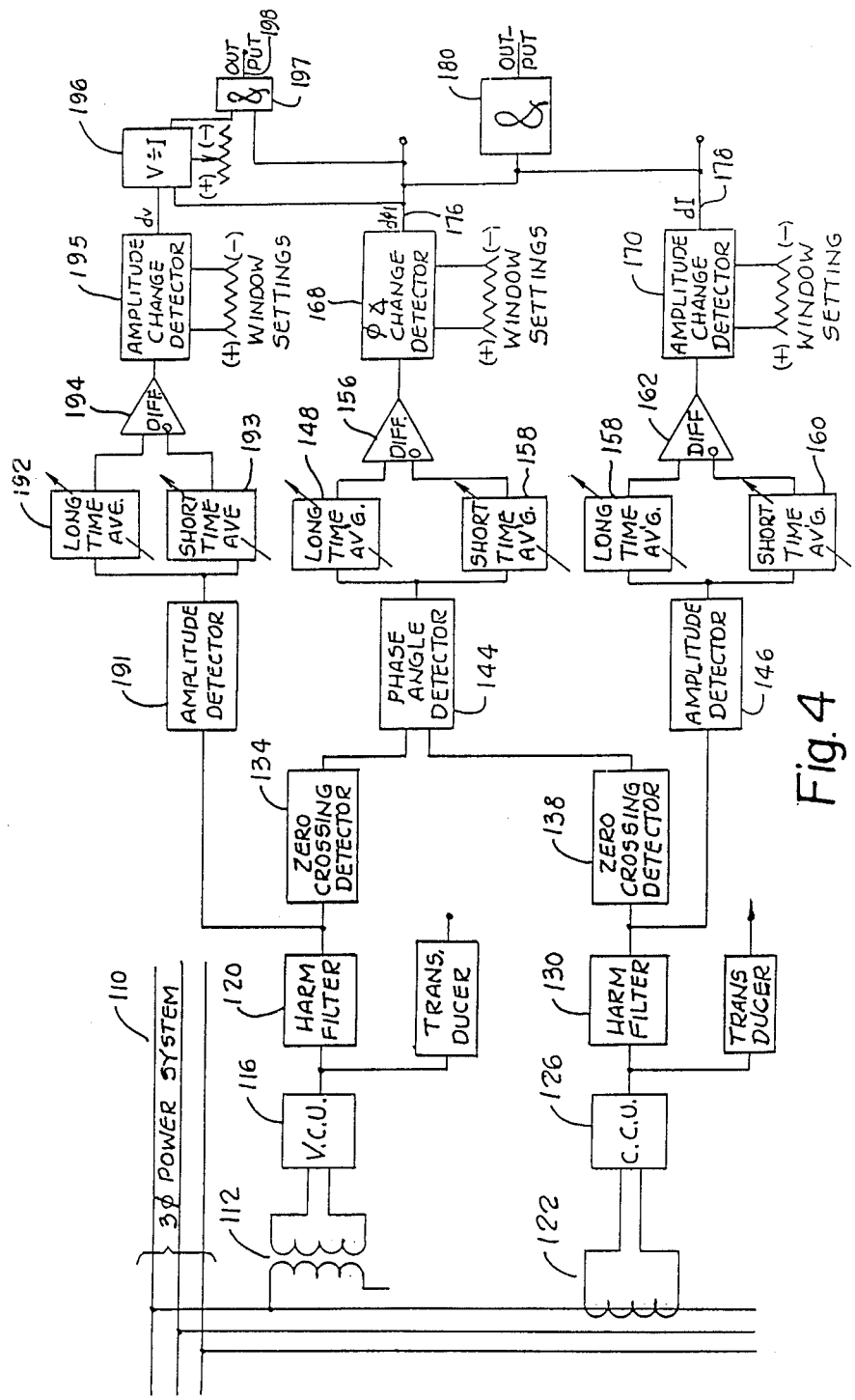
FIG. 4 s a block diagram illustrating another embodiment of an analyzer system detecting high impedance faults on an electric power distribution system.

In preparation to describing specific fault analyzer systems for solving problems relating to the detection of high impedance faults and distinguishing them from ambient system conditions, it is desirable to discuss to some extent the theory and consequences of the occurrence of high impedance faults.

FIG. 2 illustrates at reference character 6 distorted current resulting from a high impedance fault that peaks as at 7 shortly after the voltage maximum illustrated at 8. In other situations, the fault may momentarily extinguish as the current goes through zero, and then reignite several electrical degrees later into the next half cycle. Analysis of these and other distorted waveforms has shown that a major difference between harmonics generated by normal system conditions and harmonics generated by high impedance faults and other abnormalities is in the phase relation of the harmonic currents occurring in the system to the fundamental frequency component of voltage occurring in the electrical power distribution system.

The magnitude of these harmonics will also vary, depending both on the nature of the distortion and the ratio of the nonlinear impedance to the linear impedances in the electrical network. It follows that the harmonic current "signature" of a high impedance fault is different from that of the connected nonlinear devices on a power system and that detection of this difference can be achieved.

In this disclosure the term "harmonic" is used in its broader sense to mean any signal whose frequency is locked in synchronism to the system frequency. This includes the classical harmonic and subharmonic, as well as "fractional harmonics" i.e., whole integral multiples of a subharmonic.

In a practical electric power distribution network, the ambient harmonic values are constantly changing due to normal, non-fault circumstances, and over the course of a normal day or week may vary to a much larger extent than any variation caused by a high impedance fault or other abnormality. The harmonic ambient varies, as mentioned above, because both the sources of the harmonics and the sinks for the harmonics are both changing constantly. Also, changes in the network configuration will cause redistribution of the harmonic ambient flow. For example, whenever there is a change of state in an a.c. network, there must be a transient, some component of which may be at the harmonic frequency used for high impedance fault detection. Switching of capacitors on and off in the system can cause significant changes in the harmonic ambient, as well as create additional harmonics during the actual switching operation.

Therefore, as pointed out above, a simple harmonic amplitude measurement will not provide a reliable high impedance fault detecting system. Similarly, simply detecting the phase of a harmonic will not generally be sufficiently discriminating to have general application for high impedance fault detection.

However, by monitoring the harmonic ambient over a relatively long period, and by comparing any shorter term sustained value of the harmonic to the monitored ambient, a positive identification of a high impedance fault can be achieved. In some networks, this procedure need only entail monitoring the phase relations between the harmonic and the fundamental. In other networks, usable high impedance fault detection results can be obtained by comparing the ambient magnitude of the harmonic with changes in the present value of the harmonic magnitude. And in other situations comparing the ambient changes of both the magnitude and the phase can result in a suitable detector.

For a more general solution, however, free of misinterpretation of harmonic changes from routine events, it is desirable, to monitor the change in the phasor values, i.e., phase and magnitude of the harmonic treated as a single entity. A harmonic current phasor, when properly referenced to the fundamental frequency of the voltage, inherently provides a sense of direction of the harmonic current flow. Similarly, the change in the harmonic current phasor, when referenced to the change in the harmonic voltage phasor, can be used to identify whether the abnormality is an event upstream or downstream from the point of observation in the power distribution network.

Since this upstream-downstream determination is based on the changes in the harmonic voltage and current, it is dependent only on the location and nature of the fault or abnormality, and on the total network impedances and distribution factors of the harmonics at the measured frequency.

This latter measurement need not be made at a true harmonic of the system frequency, except for convenience that such a measurement provides. Thus, any frequency generated by the abnormality may be used, and the harmonic need not be an integral multiple of the system fundamental frequency for this phasor voltage to phasor current ratio to be meaningful.

It is of significance that the ambient monitoring function cannot be effectively carried out by comparing the harmonics on one phase against those of a second phase where a polyphase electric power distribution network is used. While in general the harmonics may appear comparable on the various phases of a polyphase system, they are in fact the sum of largely single phase phenomena and cannot be relied upon to stay sufficiently equal to provide a simple method of maintaining a reliable ambient reference.

These facts are confirmed in the following publication, which is hereby expressly incorporated by reference: EPRI Report No. EL2430, Project 1285-2, June, 1982, "High Impedance Fault Detection Using Third Harmonic", where on page vi the project manager stated "...work on this project is not expected to continue...".

The essence of the project described in the EPRI publication is the comparison of the harmonic currents on one phase to those on another as shown in FIG. 4.1 and 4.7 of the publication. This comparison is of current magnitudes on one type of power system and of current phase angles on another type, but a true phasor comparison is never noted, nor is a current comparison to the system voltage or a harmonic of the system voltage ever discussed. Additionally, of course, in a single phase circuit, there is no second phase for comparison.

Nevertheless, there is still need for a three phase high impedance fault detector to minimize equipment complexities in locations where a three phase installation is desired.

High impedance fault detection in a three phase environment can be accomplished by interposing, between the power system three phase values and the harmonic analyzer, as described below, a voltage and current symmetrical sequence segregating network of a type such as described in U.S. Pat. No. 3,699,441, which is hereby expressly incorporated by reference. A positive sequence voltage and a negative sequence current and voltage signal from these networks are used respectively and directly into the single phase system described below in more detail.

In this way, the single phase analyzer devices described below in connection with FIGS. 3, 4 and 5 can be adapted to facilitate high impedance fault detection in three phase systems, which greatly enhances their usefulness. One can also use zero sequence quantities for the signals with the described analytical devices for identifying high impedance faults on a polyphase system. However, this solution must fathom the desired single phase information from the sum of the harmonics of all three phases. The additional signal filtering need is not required with the noted sequence segregating network, since the zero sequence quantities are largely eliminated in the network.

FIG. 3 is a block diagram illustrating an analyzer system coupled to an electric power distribution system network 10 to produce indications in response to the occurrence of high impedance faults or other abnormalities on the designated circuit in the power system network.

A high voltage instrument transformer 12 is coupled to one phase of the power system network 10. It is to be understood that the detection system of FIG. 3 is applicable either to detecting high impedance faults or other abnormalities.

The output of the secondary of the transformer 12, at leads 14, bears the instantaneous voltage signal from the phase to which the primary of the transformer 12 is coupled. This output voltage is presumed to be a nominal 120 volts.

The instantaneous a.c. voltage signal appearing at the leads 14 is directed to a voltage conditioning unit 16, of known design whose function is to scale the voltage signal to a level which is compatible for operation and processing by means of the downstream circuitry which will be discussed below. Selection of the degree of this scaling function, given the identity of the downstream circuitry and its requirements, is well within the ordinary skill in the art.

A scaled voltage signal appears at the lead 18, and is transmitted to a filtering network 20. The filtering network 20 serves to strip off substantially all frequencies on the a.c. voltage signal appearing at the lead 18, except for the fundamental frequency. In the embodiment of FIG. 3, the fundamental frequency is assumed to be 60 Hz. It is to be understood, however, that, if another fundamental frequency is used, the filtering network 20 is designed to pass substantially only the fundamental frequency.

The scaling voltage conditioning unit 16 is designed in this embodiment to bring the output voltage at the lead 18 to within the neighborhood of 5 volts.

A high voltage current transformer 22 is also coupled to the same phase to which the high voltage instrument transformer 12 is coupled. The secondary of the transformer 22 produces, at the leads 24, a signal corresponding to the instantaneous value of current in the measured phase. The signal at the leads 24 is directed to a current conditioning unit 26, whose function is to transform a nominal 5 amp. current to a lower level voltage signal which is suitable for facile handling and processing by downstream circuitry to be described below. In the embodiment of FIG. 3, the current is converted by the current conditioning unit 26 to a value represented by a voltage signal in the neighborhood of 5 volts.

The current conditioning unit 26 preferably comprises a suitable current shunt or transformer. Transformers are preferred, both for the current conditioning unit 26 and the voltage conditioning unit 16.

The current conditioning unit 26 produces, at a lead 28, a scaled a.c. signal corresponding to the instantaneous value of current in the measured phase to which the primary of the transformer 22 is connected. The signal at the lead 28 is transmitted to a 180 Hz. filter circuit 30, which is designed to strip off the signal at the lead 28 substantially all frequency components other than the third harmonic of the fundamental, in this embodiment this component having a frequency of 180 Hz.

The filtered, or "clean" fundamental frequency voltage signal is transmitted, by means of a lead 32, to a zero crossing detector 34. The voltage crossing detector 34 produces a signal with each zero crossing of this fundamental component voltage signal.

The filtered or "clean" third harmonic current signal is transmitted, by way of a lead 36, to another zero crossing detector 38. The zero crossing detector 38 produces a signal with each zero crossing of the third harmonic current indicating signal.

Preferably, the filter circuits 20, 30 comprise narrow band pass filters in order to minimize the effects of any signal in close frequency proximity to the signal which is desired to be passed through. However, in order to minimize the phase shift effects of frequency deviations the fundamental system frequency, the filters 20, 30 should also be designed for minimum phase shift in the pass band, and be of substantially identical design, and tuned to exactly the three to one ratio of the desired pass bands.

The 60 Hz. and 180 Hz. zero crossing signals, appearing at the leads 40, 42, respectively are compared in a phase angle detector unit 44. The phase angle detector unit 44 includes circuitry, of known type, for removing any ambiguity due to the fact that there are three current zero crossings for each voltage zero crossing because of the three to one frequency ratio between the signals. This means for eliminating ambiguity preferably comprises circuitry identical to that in FIG. 5, device identified by reference characters 244 through 249 and 268 through 273, in which the RS flop-flop is set by the positive going zero crossing of the 60 Hz reference wave and reset by the first zero crossing of an similar positive going zero crossing of the harmonic signal. Subsequent harmonic zero crossings are thus ignored until the flip-flop is set by the next zero crossing of the fundamental reference frequency.

The current harmonic signal appearing at the lead 36 is additionally transmitted to an amplitude detector circuit 46. Since this signal is substantially a sine wave, an rms or an average type amplitude detector is preferred. However, in view of the possible low level of this signal, a precision type rectifier is suggested. Such a rectifier consists of an op-amp suitably connected and with a diode in the feedback path thus resulting in no signal output on alternate half cycles due to cancellation on alternate half cycles. Since the diode is functioning in the high impedance feedback circuit, its non-linearity error becomes negligible. See "IC OP-AMP Cookbook" by W.G. Jung, pp. 198–200.

The output of the phase angle detector unit 44 is a d.c. voltage representing the phase angle difference between the voltage fundamental and current harmonic signals presented to the phase angle detector unit over the leads 40, 42. This output from the phase angle detector is transmitted as an input to both a relatively long time averaging circuit 48 and to a relatively short time averaging circuit 50. The longer time averaging circuit 48 provides an output at a lead 52 which is a d.c. value corresponding to the ambient value of the phase difference between the fundamental frequency voltage signal and the harmonic current signal taken over the long time average. Preferably, the long time averaging circuit 48 is provided with means for adjusting the averaging time between approximately 10 seconds and 10 minutes. It is to be recognized, however, that, in some instances, a fixed averaging time would be sufficient.

Similarly, the short time averaging circuit 50 produces a d.c. output at a lead 54 which represents the average of the phase difference between the fundamental frequency voltage signal and the harmonic current signal over a shorter period of time than is averaged in the long time averaging circuit 48. Preferably, the short time averaging circuit 50 is provided with an adjustable averaging period of between approximately 0.1 seconds and 5.0 seconds.

The difference between the long term averaging value at 52 and the short term averaging value at 54, corresponding to the change in the phase angle of the third harmonic current signal to the fundamental frequency voltage signal, can be measured by any known means, the preferable means illustrated in FIG. 3 being a differential input amplifier 56.

The output of the amplitude detector 46, corresponding to the amplitude of the harmonic current signal, is processed in a manner similar to that described above in connection with the output of the phase angle detector unit 44. That is, the output of the amplitude detector 46 is presented in parallel to the respective inputs of a long term averaging circuit 58 and a short term averaging circuit 60. The outputs of the averaging circuits 58, 60 are then compared in a differential amplifier circuit 62.

The amplitude averaging circuits 58, 60 are provided with averaging time adjustment means comparable to those associated with the averaging circuits 48, 50 described above. Preferably, the two long term averaging circuits 48, 58 are preset to average over the same time period. Also, it is preferable to set the averaging time adjustment means associated with the short term averaging circuits 50, 60 to the same level, which is shorter than the level associated with the long term averaging circuits 48, 58.

Preferably, the ratio between the long term and short term averaging times is approximately the same as for the phase angle measurement.

The differential amplifier circuits 56, 62 each produce an output which is a d.c. function of the difference between its respective inputs. These signals appear respectively at output leads 64, 66. These output signals represent the changes from the ambient averaging caused by the occurrence of a high impedance fault or other abnormality. These output signals are then processed respectively in window type level detectors 68, 70. Each window level detector produces an output when its input has a value which is inside the window defined by the window detector circuit. The setting of the upper and lower window levels in each window detector circuit can be fixed, but, preferably, separate adjustment means 72, 74, are provided for the window level detectors 68, 70, respectively.

The outputs of the window level detector circuits 68, 70 are provided at outputs 76, 78, respectively, and are also presented as inputs to an AND gate 80. The AND gate 80 provides a d.c. output at 82 when (1) the phase change in the third harmonic current signal from its ambient value, due to a high impedance fault or other abnormality, is in a prescribed relationship to the fundamental frequency voltage signal, and (2) when the amplitude of the harmonic current signal changes in a predetermined amount from the ambient.

Additionally, d.c. output signals representative of respective a.c. quantities for unfiltered and filtered voltage and current, signals, appear at the outputs of transducers 84, 86, 87 and 88 as shown in FIG. 3.

FIG. 4 illustrates a variant on the system of FIG. 3, in which redundancy to the high impedance fault detection is added. This redundancy confirms by other means the direction (upstream or downstream) from the location, at which the fault or other abnormality is located in the electric power system. In this variation, the ratio of the change in the harmonic voltage to change in the harmonic current is also determined. This ratio will be a function of the system sink impedance at the measured harmonic frequency as viewed from the measurement location. Since this harmonic sink impedance will usually be substantially different upstream and downstream from the observation point, this magnitude measurement will provide an independent means for the determination of the direction to the abnormality. The quadrant in which change lies will further identify whether the high impedance abnormality is upstream or downstream from the point of measurement.

In FIG. 4, the components 112, 116, 122, 126 and 130 are substantially the same as the corresponding components 12, 16, 22, 26 and 30 as described in connection with FIG. 3. The filter 120, of FIG. 4 is tuned somewhat differently, however, than in the case of FIG. 3 filters 20. In FIG. 4, the filter 120 is pass band filter tuned to the same harmonic of the fundamental frequency of the power system 110 as filter 130. This is in contrast to the FIG. 3 embodiment in which the filter 20 was tuned to the fundamental frequency and the filter 30 was tuned to the third harmonic.

As in the filters of FIG. 3, the filters 120, 130 of FIG. 4 are of the same basic design, so that phase shifts due to nominal system frequency changes do not disturb the calibration of the system.

The voltage harmonic signal produced at the output of the filter 120 is impressed on an amplitude detector circuit 191, long and short term averaging circuits 192, 193, differential amplifier 194, and amplitude change detection circuitry 195, which components function similarly to the components 46, 58, 60, 62 and 70 associated with the current signal path described in connection with FIG. 3.

The processing of the harmonic current signal in the system of FIG. 4 is analogous to the processing of the current harmonic signal of the FIG. 3 system by way of amplitude detector 146, long and short term averaging circuits 158, 160, differential amplifier 162 and change detector 170. The phase detection function in FIG. 4 is performed identical to FIG. 3 except that the reference voltage signal from filter 120 is the harmonic frequency whereas in FIG. 3 the reference voltage signal from filter 20 is the fundamental frequency. Zero crossing of the voltage signal is determined in 134 and for the current signal in 138.

The harmonic voltage signal change from the detector 195, and the harmonic current change signal from the detector 170 are ratioed in a divider circuit 196 which produces a d.c. signal corresponding to the ratio between the voltage and current change signals. The harmonic voltage and harmonic current signals are transmitted through respective zero crossing detectors 134, 138, whose function is analogous to the detectors 34, 38 in FIG. 3. The phase of the voltage harmonic and current harmonic signals is then compared in a phase angle detector 144 which is analogous to the detector 44 in FIG. 3. The phase difference signal output from the phase angle detector 144 is directed in parallel through long term and short term averaging circuits 148, 154, and to a differential amplifier detector 156. The function of the circuits 148, 154, 156 is analogous to that of the circuits 48, 50, 56 in FIG. 3. The change in phase difference signal is input to a phase change detector 168, which functions in a manner analogous to the detector 68 of FIG. 3. The phase change signal appears at an output 176 from the detector 168.

The phase change output at the lead 176 is directed in parallel, respectively, to AND gate circuits 197, 180. The amplitude change signal corresponding to the harmonic current is directed from terminal 178 to the other input of the AND gate 180. The harmonic current change signal appearing at the lead 178 is also directed as a second input to a ratio divider circuit 196 to enable the circuitry 196 to perform the ratioing function between the voltage harmonic magnitude change signal to be ratioed with the current harmonic change signal.

It can be seen from the foregoing description that, when (1) the ratio between the voltage harmonic change signal and the current harmonic change signal and (2) the phase difference between the voltage harmonic signal and the current harmonic signal, are both within predetermined limits, an output appears at the lead 198 from the AND gate 197. When either of these conditions do not obtain, no output is present at the lead 198.

As in the case of the FIG. 3 embodiment, an output is present at the lead 182 from the AND gate 180 only when the phase difference between the voltage harmonic change signal and the current harmonic change signal is within a certain predetermined range and when the amplitude change of the current harmonic signal is within a predetermined range as well.

The significance of the various states of outputs at the leads 182, 198, is as follows signal 182 is comparable to signal 82 of FIG. 3 and provides an output when the change in magnitude and the change in phase of the input signals are within set limits. Signal 198 is an output only when the ratio of the change in the voltage and current harmonic signals is within a prescribed range plus the change in phase angle is within the set limits.

The above description has been set forth in functional terms and is equally applicable to circuitry based on analog components or digital, microprocessor components or a combination of these techniques.

The functions described in connection with any of the embodiments typified in FIGS. 3 & 4 can be performed in a more flexible and generally more applicable manner by the use of a combination of the embodiment of analog and digital techniques as set forth in FIG. 5 and 6. The FIG. 5 embodiment includes means for developing three input voltage signals.

Figure 5:
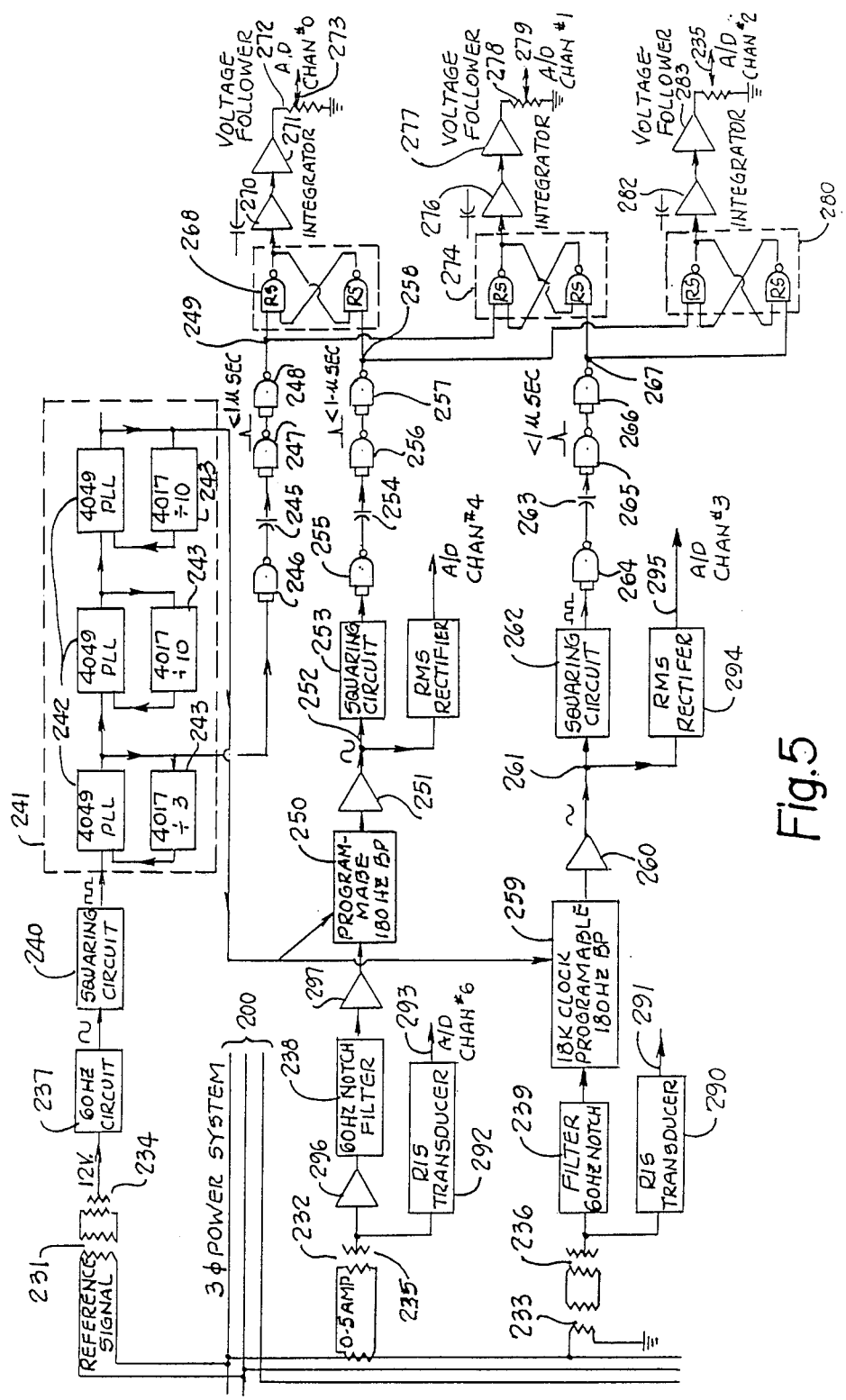

The FIG. 5 embodiment produces a voltage signal at 233 representing the voltage to ground at the circuit under observation on the power system. The FIG. 5 embodiment also produces a current signal at 232 representing the current in the circuit under observation in the power system. The FIG. 5 embodiment also produces a reference signal 231, which may be chosen to represent any stable voltage or current signal within the same power system.

Often this reference signal occurring at 231 will be the same signal as the voltage signal appearing at 233. This reference signal, in addition to providing the flexibility of an arbitrary reference, provides a means for checking the proper functioning of the detector system embodiment.

With three input signals, three comparisons can be made between the three outputs as derived from these three signals, even if two of the input signals are the same signal. Whenever these three comparisons are not rational, i.e., do not total to zero on a phasor basis, there is an error in the signal processing system.

Similar to the embodiments of FIG. 3 and 4 means are provided in the FIG. 5 embodiment, at 234, 235 and 236 to convert each of the input signals to a voltage level suitable for handling and processing by the downstream electronic circuitry to be described below. When transformers are used for this signal conditioning, an electrostatic shield is preferably included to minimize common mode noise, and a small shunt capacitor can be included to reduce high frequency noise on the incoming signals in the lines 231, 232, 233.

When the current signal circuit includes means for converting or conditioning the current signal 232 to a voltage signal, i.e., a shunt resistor and an operational amplifier such as at 296, the design of the electronics of the FIG. 5 embodiment is simplified.

Band pass filters, as at 237, 238, 239 are provided for filtering each of the respective three signals to strip off unwanted information and/or noise. The reference signal filter 237 removes substantially all frequencies significantly above and below the fundamental system frequency. The band width of this filter 237 is preferably wide enough to accept the nominal variations in system fundamental frequency without undue change in its phase shift.

The current and voltage filters 238, 239, respectively, are band pass filters which pass the desired harmonic while stripping off the higher frequency harmonics and noise components. The filter circuits 238, 239 also include means for performing a band rejection (notch) filter function, tuned to reject the system fundamental frequency. These filtering circuits 237, 238, 239 may be of the passive, active or digital type.

A squaring circuit 240 is provided for squaring the reference signal originating at 231 so that the zero crossing of the signal are established with precision.

Circuitry 241 receives the output from the squaring circuit 240 to phase lock an 18 kHz. "tracking" oscillator. By means of known integrated circuitry identified at 242, 243, the generated 18 kHz. signal is divided by 10 twice and by 3 once to provide a 60 Hz. line frequency signal which is phase compared and phase locked to the reference input signal in a known circuit configuration.

Means is thus provided for the 18 kHz. oscillator to track the line frequency variations of the power distribution network system and to maintain a precise phase relationship between the oscillator and the zero crossing of the system frequency.

Circuitry 241 also provides, in the frequency division, means for a 180 Hz. square wave signal (when the third harmonic is under analysis) at lead 244, which signal is also phase locked to the system frequency.

This 180 Hz. signal at the lead 244 is differentiated in a capacitor 245 with buffers and polarity changers 246, 247, 248. This operation results in short pulses (on the order of 1 microsecond), appearing at a junction 249. The fronts of these pulses are always phase locked to the zero crossings of the fundamental component of the reference signal.

The current signal, originating at the lead 232 and after filtering in the filter circuit 238, is buffered in an operational amplifier 297 and then filtered in a programmable digital band pass filter 250. A preferable embodiment of the filter 250 is a national-MF10CN. This digital filter is driven by the 18 kHz. clock frequency produced in the oscillator 241 and strapped to provide a 180 Hz. band pass filter characteristic in known fashion. The output of the filter 250 is buffered in an operational amplifier 251 and produces at a junction 252 a sine wave of the 180 Hz. third harmonic component of the input current signal.

This sine wave is in correct time phase with this component of the input signal appearing at the lead 232, and is scaled in correct magnitude. This third harmonic of the current signal is then squared in a squaring circuit 253 to assure accurate zero crossing determinations, and then differentiated in a capacitor 254, with buffers and polarity changers 255, 256, 257.

This processing results in pulses appearing at a junction 258, having fronts which are always coincident with the zero crossing of the third harmonic of the input current signal at the lead 232.

The input voltage signal appearing at the lead 233 is processed in exactly the same way as the current signal from the lead 232. The output signal of the filter 239 is further filtered in a programmable digital filter 259, buffered in an operational amplifier 260, resulting in a sine wave of 180 Hz. appearing at a junction 261 and squared in a squaring circuit 262. The signal is subsequently differentiated in a capacitor 263 and buffered and polarity changed in circuitry designated as 264, 265 and 266.

The result is that pulses appear at a junction 267, such pulses have fronts which are always coincident with the zero crossings of the third harmonic of the input voltage signal originally appearing at 233.

The time differences between the three pulse trains arriving respectively at the junctions 249, 258, 267 are measured in known flip-flop circuits in a manner described below. More specifically, the reference signal pulse train appearing at the junction 249 sets RS flip-flop 268. The current pulse train appearing at the junction 258 resets the flip-flop 268. Thus, the output from the flip-flop 268, appearing in the form of pulses 269, has a duration proportional to the time that the zero crossing of the current input signal lags that of the reference signal zero crossing.

This pulse train appearing at the lead 269 is next integrated, or averaged, in an operational amplifier 270, and buffered in an operational amplifier 271. The resulting signal constitutes an analog d.c. voltage signal whose value represents the phase difference between the harmonic in the current signal appearing at the lead 232, and the fundamental frequency in the reference signal appearing at the lead 231. The result is scaled in a potentiometer 272, which yields an output signal at a lead 273 which is suitable for further electronic processing.

In a similar manner the pulse train from the voltage input signal appearing at the junction 267 is compared to the reference signal appearing at the lead 249 in an RS-flip-flop 274, yielding a pulse train at the lead 275 the pulses of which have a duration proportional to the phase difference between the harmonic in the output voltage signal originally appearing at the lead 233 and the reference signal. This pulse train in then integrated in an operational amplifier 276, buffered in an operational amplifier 277 and scaled by means of a potentiometer 278, yielding an analog output signal at the lead 279 representing the phase difference between the harmonic in the input voltage signal at the lead 233 and the reference signal appearing at the lead 231.

The voltage and current signal pulses are similarly compared with the current signal pulses at the junction 258, setting an RS flip-flop 280. The voltage signal pulse appearing at the lead 267 resets the flip-flop 280. The output of the flip-flop 280, appearing at the lead 281, is integrated in an operational amplifier 282, buffered in an operational amplifier 283 and then scaled by means of a potentiometer 284. This process yields an analog signal appearing at a lead 285 which represents the phase difference between the harmonics in the input current and voltage signals, respectively, appearing at the leads 232, 233. This signal at the lead 285 should equal the signal at the lead 273, minus the signal appearing at the junction 279 when the fault detection system is in correct calibration.

Figure 10:
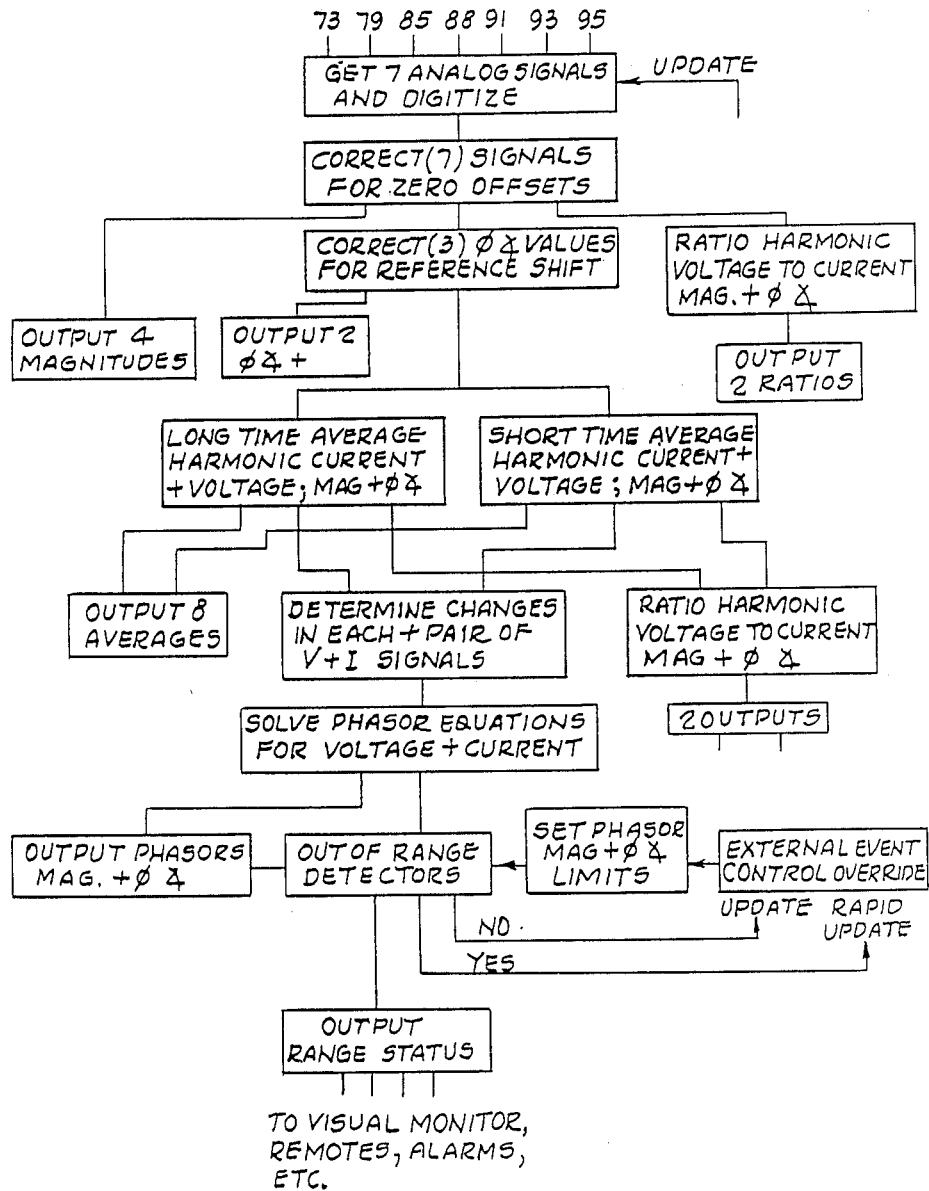
FIG. 10 is a flow chart illustrating operation of the embodiment of FIGS. 5 and 6.

These three output signals 273, 279, 285 representing phase relations (and other quantities to be described below in the digital section of the preferred embodiment) are fed into a microprocessor 301 with a keyboard, 302 which is represented in general form in FIG. 6. In the microprocessor, each of these three signals is first digitized and encoded in known fashion to provide digital output signals 273E, 279E, 285E, as outputs from the microprocessor 301. While the specific setup of the microprocessor, given the functional requirements stated herein, is with the level of ordinary skill, the complete functional arrangements in the microprocessor 301 are shown in FIG. 10, for the benefit of those not skilled in this art.

These include, additionally, in the microprocessor 301, two average value signals being determined for each of the three signals 273E, 279E, 285E. Each average is preferably derived exponentially, i.e., the previous average is reduced by a given percentage and the new value added at a value equal to 100% minus this percentage. By programming this percentage to different amounts, the effective averaging time can be varied over wide limits. If the percentage figure is small, the averaging time will be long. A small percentage figure is used to established the average value of the phase angle ambient representing signal. The resulting average signals are provided as output signals 273L, 279L, 285L.

If the percentage figure is large, the averaging time will be short. A large percentage figure is used to establish the current value of the phase angle ambient representing signals 273S, 279S, 285S. The subtraction of the long time average ambient from the short time average of each signal yields signals D273E, D279E, D285E, representing the change in phase position of the respective input signals 273, 279, 285 due to whatever cause. Signals 273S, 279S, 285S, D273E, D279E and D285E are also provided as output signals.

The averaging technique discussed above is disclosed in detail in the following publication, which is expressly incorporated by reference: "Power System Harmonics" by Arrillaga, Bradley & Badger, published by John Wiley, pp. 146–149 and 158.

In the preferred embodiment, the microprocessor 301 is a 6502 CPU. The keyboard is also conventional.

Four other signals are processed as shown in FIG. 5 and then input to the microprocessor (FIG. 6). The input current signal at 286 is converted to a d.c. signal in a transducer 287 (see FIG. 5) yielding a d.c. output signal at 288 which represents the magnitude of the input current signal 232. Similarly, the input voltage signal at 289 is converted in a transducer 290 to a signal at 291 representing the magnitude of the input voltage signal 233. After the current input signal at 232 has been filtered to provide the desired harmonic, as at junction 252, it is then converted to a d.c. signal in a transducer 292, yielding a d.c. output signal at a lead 293 representing the magnitude of the selected harmonic in the input current signal 232. In like fashion, the filtered voltage signal harmonic, appearing at a lead 261, is converted to a d.c. signal in a transducer 294, which produces a d.c. signal at a lead 295 representing the harmonic magnitude in the input voltage signal 233.

The four signals at the leads 288, 291, 293, 295, representing the magnitudes described above, are input to the microprocessor 301. The signals at the leads 288, 291, representing the magnitudes of the power system input current and voltage signals, are processed by digitizing them, scaling them for correct magnitude, and by encoding in known appropriate fashion. The results of these operations are produced as output signals at leads 288E, 291E. These as well as all other output signals can be recorded as desired on suitable memory such as disc, and can also be transmitted to a display monitor and to any other desirable external or peripheral equipment. The current and voltage harmonic magnitudes, represented by signals at the leads 293, 295, FIG. 5 are processed similar to that applied to the phase angle representing signals 273, 275, 285, discussed above, i.e., they are first digitized, then encoded to provide output signals at leads 293E, 295E.

Additionally, long term averages, outputed as signals at the leads 293L, 295L, and short term averages, 293S, 295S are developed for each of the signals at the leads 293, 295. The long term average is subtracted from the short term average to yield the change in magnitude of each signal, and are then outputed at the leads D293E, D295E, respectively. These averaging periods can be established for any desired value. It is preferred, however, to make all long term averaging periods the same and similarly, to make all short term averages the same in the system. Note that the change in magnitude of a given signal is based on the change in its own value, whereas the change in phase angle is defined with respect to the fundamental frequency component of the reference signal, and in the case of $V_3$ vs. $I_3$, with respect to $I_3$.

The change in the magnitude and phase of each signal defines the phasor value of that change.

These phasor values are determined by conventional trigonometric formulas such as by applying the cosine law, viz: $a^2 = b^2 + c^2 - 2bc*cosA$, where abc are the sides of the triangle and ABC are the opposite angles.

In terms of FIG. 5 and 6, this is, for the harmonic current signals, $I_f = [(293L)^2 + (293S)^2 - 2*(293L)*(293S)*cos(D273E)]$, where $I_f$ is the magnitude of the phasor of the change in harmonic current.

$A = sin^{-1}[(293L/I_f)*sin(D273E)]$, where A is the angle between the phasors of the change and the long term average.

$F = [(273L) + 180° - A]$, where F is the angle of the phasor of the change to the system voltage reference.

The phasor change of the voltage harmonic signal is determined in a similar manner.

Figure 9:
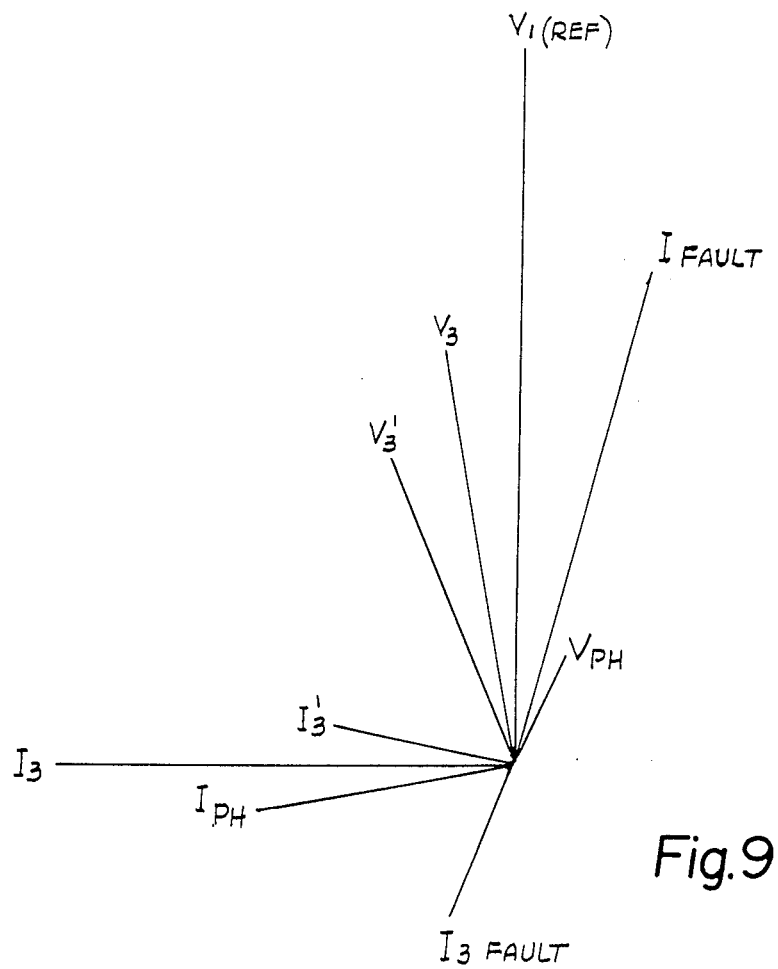
FIG. 9 is a phasor diagram produced by an actual fault measured by the present invention.

The efficacy of these equations and the value of determining the phasor change as contrasted to simple level detectors to recognize change, is shown in FIG. 9. This figure is a plot of actual field data derived from the system described in FIG. 5 and 6 during staged high impedance faults. Not shown are the normal values of the phasor changes, $I_{ph}$ which result from the constantly changing ambient. These values are too small and random to show.

The microprocessor provides a window such that only a given range of phasor values is passed to an output circuit. The magnitude window is set separately from that of the phase angle window. These adjustable windows enhance the use of the system as a research tool for harmonic surveys of a power system by serving as alarm set points to pinpoint an out of range condition. They also provide means for varying the set levels of the output signals of the system when it is used primarily as a protective device.

The output signal at the lead 273/293W is an "on" signal when the phasor value of the change in the third harmonic in the input current signal 232 is within both magnitude and phase angle windows. Similarly, the signal at the lead 279/295W is "on" when the phasor value of the change in the third harmonic of the input voltage signal is within both the magnitude and phase angle windows.

The microprocessor 301 can have the flexibility of being controlled from a preprogrammed internal ROM or associated keyboard 302 or a combination of both. All changes in set-points, averaging parameters, phasor windows, printing instructions and all housekeeping functions are most conveniently input to the microprocessor 301 from the keyboard 302. Also provided are means for interface device 303 to input instructions to the microprocessor based on a response to external conditions. These external conditions could, for example, be a major change in generator scheduling or switching lines, transformers, loads, capacitors or any other measurable event that would be likely to materially change the distribution factors in the power distribution system network of the harmonic phasor currents under observation. These updating instructions from 303 can be set into the system manually or automatically. It may be raw data input or processed data via an intermediate device. All values and instructions to the processor can be read out at any time on command and will appear at output lxx.

Figure 8:
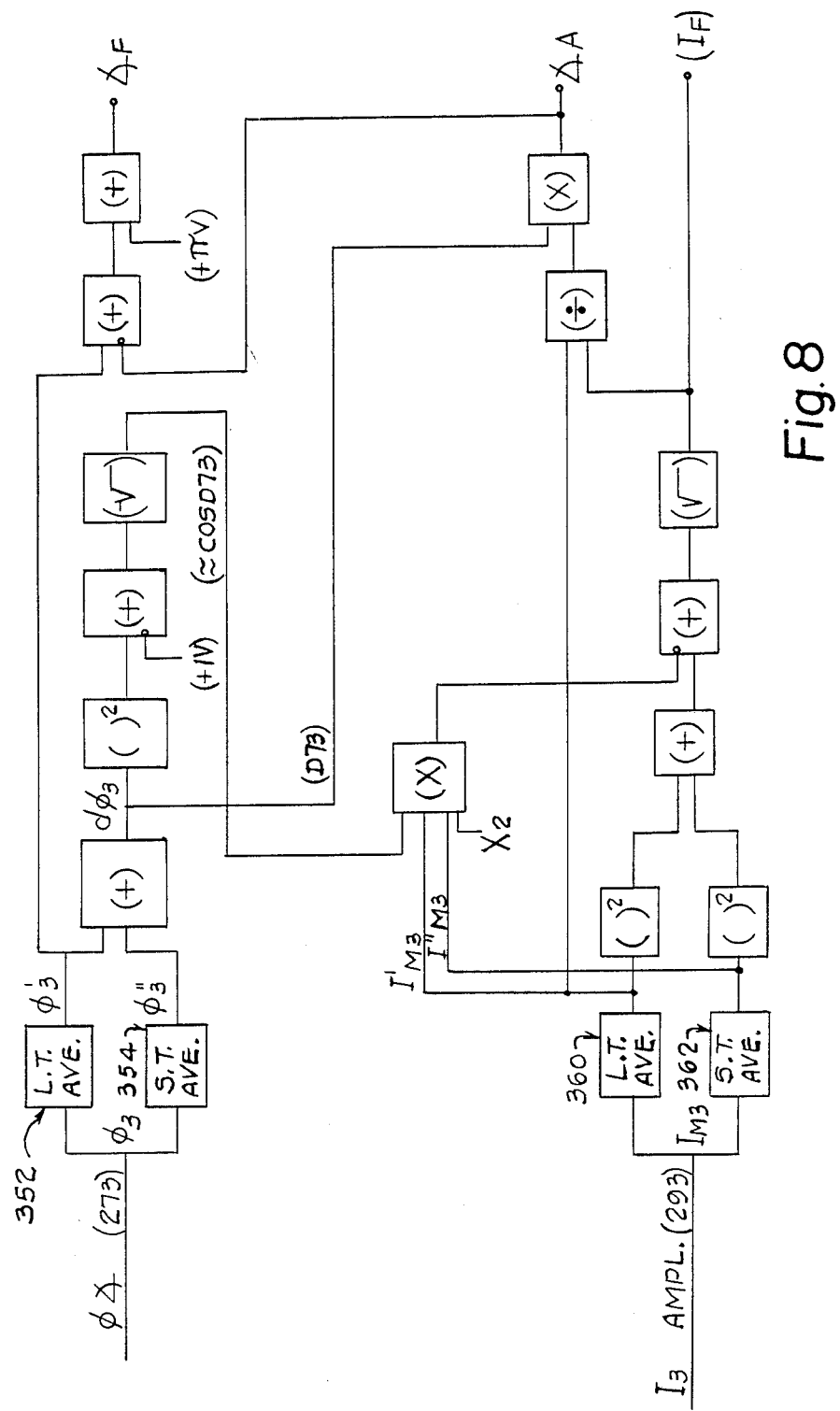
FIG. 8 is a block diagram illustrating an alternate analog measuring technique for the embodiment of FIGS. 5 and 6.

The determination of the phasor value of the change caused by a high impedance fault or other abnormality can also be accurately determined by an analog means as shown in FIG. 8, which is used in conjunction with FIG. 5 or any other basic harmonic separation system. In FIG. 8 input signals of the phase angle and magnitude of the third harmonic are represented by signals at 273 and 295 from FIG. 5 and scaled to appropriate values. The long and short term averages of each signal is then determined as shown at reference characters 352 and 354, and 360 and 362. Each signal is then processed as shown in each block to solve the above three equations given for FIG. 6. The solution in FIG. 8 is approximate in that the sine, tangent and angle are substantially equal for very small angles. Since, in most applications, only angles of over 30° are not expected, and since all signals are manipulated in this same manner, the computational error is small and can be accommodated in the calibration and alarm settings if necessary. FIG. 8 is intended to illustrate that analog solutions are feasible as well as digitized solutions. Variations in these mathematical manipulations in either the digital or analog solutions is within the spirit of this invention so long as they lead to the determination of the phasor of the change in the harmonics.

An important use for the fault analyzer system of the present invention is on a three phase circuit. This can be accomplished with three single phase fault analyzer devices as described in connection with FIGS. 3, 4, 5 and 6, or one device can be used by interposing symmetrical sequence networks between the power system and one harmonic fault analyzer as shown in FIG. 7.

In FIG. 7, sets of leads 412, 413, 414 and 415, 416, 417 provide connections from the power system current and voltage transformers to the current and voltage sequence networks 410, 411, respectively. The sequence networks 410, 411 are of known type and can be provided by those of ordinary skill in the art. For those who may not be intimately familiar with this art, however, design of such sequence networks is set forth in U.S. Letters Patent entitled "Polyphase Signal Monitoring System" No. 3,699,441, expressly incorporated by reference.

A single phase fault analyzer can also be used to measure conditions on a three phase system by measuring the "zero sequence" component harmonics. This has the drawback, however, of increasing the ambient harmonics by a factor of up to three while at the same time possibly reducing the fault indication significantly because of the shunting effect of the other two phases.

Circuit means connect the negative sequence output current signal at a lead 418 from network 410 to the harmonic analyzer input interface unit 435. Similarly, circuit means couples the positive sequence output voltage signal appearing at a lead 419 from the network 411 to the harmonic analyzer input device 434, and circuitry also provides the negative sequence output voltage signal at a lead 420 from the network 411 to the harmonic analyzer input device 436. The input interface emits signals at 434, 435 and 436, which are similar to input units 234, 235 and 236 of FIG. 5 with input adjusted to match the output signal levels of sequence filters 410 and 411.

The signals appearing at the leads 418, 420, representing the negative sequence current and the negative sequence voltage, respectively, will contain a composite of the third harmonics existing on the associated power circuit and will not relate directly to any one phase condition. When, however, a single phase abnormality occurs such as a down conductor, this change in the third harmonic in the negative sequence filter output signals 418, 420 will be substantially the same irrespective of which phase is involved. The phasor windows as set in the microprocessor 301 to derive signals indicating an abnormal condition will be slightly different when the harmonic analyzer is energized by the three phase sequence separation networks rather than directly by the single phase power system signals, if the internal phase shifts in these networks are not fully frequency compensated.

Each of the described embodiments can detect a high impedance fault, as a study of FIG. 9 will reveal. Thus the choice of which embodiment to use will depend to a large extent on the nonfault changes in ambient. The embodiment of FIGS. 5 and 6 is the most flexible and secure and can be set to provide a secure output for any type of system and ambient. It also requires a minimum of field observations to apply. Typical settings for the 3rd harmonic magnitude window of 0.1% of feeder rating and a phase angle window of 100°, centered about an angle either measured or calculated should result in a secure sensitivity down to a fault current of 1% of circuit rating.

The embodiment of FIG. 3 would be used where the primary fault characteristic always results in a sufficient change in either the 3rd harmonic magnitude or phase angle change to yield a setting not subject to undesired operations. A similar angle window and higher amplitude window, say up to ten times that for FIGS. 5 and 6 in some cases would seem appropriate.

The embodiment of FIG. 4 has redundancy added to FIG. 3, thus the amplitude could be set nearer to that of the FIG. 5 and 6 embodiment than to that of FIG. 3, with the ratio measurement being determined by analysis of the apparent impedances for faults upstream and downstream from the analyzer location.

The long time and short time averaging periods would be the same for all embodiments. These are set as noted previously to be long enough to establish a good average value for the ambient and short enough to provide prompt identification when a high impedance fault does occur.

It is important to recognize that, while the microprocessor of FIGS. 5 and 6 constitutes a component of the preferred embodiment of this invention, it is not necessary that a microprocessor or computer be employed. Those of ordinary skill in the art will understand, from the detailed description of the functioning and signal processing attributed to the microprocessor 301, that other means, such as hard wired, relay or other logic circuitry and adjustment means, such as described in FIG. 8, may be used in connection with the embodiments of FIGS. 3, 4 and 5 to secure results analogous to those set forth in connection with the operation of this system as described in relation to FIGS. 5 and 6.

Some of the embodiments discussed above embody circuitry for evaluating relations between various signals in the network in terms of polar coordinates. Some of this circuitry is identified as involving detection of zero crossing phenomena of various signals within the network.

It is desired to provide description of other embodiments involving conversion of various signals within the network to rectangular coordinates, and processing those signals in the rectangular coordinate form. Tests have shown that in some instances signal processing can be simplified when the signals are expressed in terms of their rectangular coordinates, rather than their polar coordinates. In some instances, embodiments utilizing signals expressed in their rectangular coordinate form employ circuitry for producing product signals in place of some zero crossing detection circuitry as discussed above. This will become apparent from the suceeding discussion.

The previously described embodiments have shown that the several signal processing functions can be executed respectively with passive or active analog or digital techniques. The following disclosure discloses embodiments which further demonstrate the significance of this flexibility of arrangement. More specifically, the desired phase relations can be determined by means other than the zero crossing technique of FIG. 5, without departing from the spirit or intent of this disclosure. Such other phase determining means comprise modulation circuits, multiplying circuits, or phase comparison circuits. Sometimes these circuits are referred to by type, such as "ring diode bridge", double bridge diodes, four quadrant multipliers, or other similar terms descriptive of the specific application or construction.

A performance characteristic common to each of these circuits is that when two signals of identical frequency are applied to the inputs, a dc output signal is developed which is proportional to the phase angle between the two input signals. This dc may also be proportional to the magnitude of one or both input signals, depending on specific circuitry and signal levels. Additionally, the output may contain an ac term of double frequency with a magnitude proportional to the magnitudes of the input signals.

The input signal magnitude component in the output signal can be suppressed, compensated for or utilized to advantage, depending on the selected circuit based on the allocation of functions between this circuitry and the ensuing signal processing needed to arrive at the desired phasor change in the processed signal. In all cases the wide dynamic range of the input signal must be adequately recognized.

Figure 11:
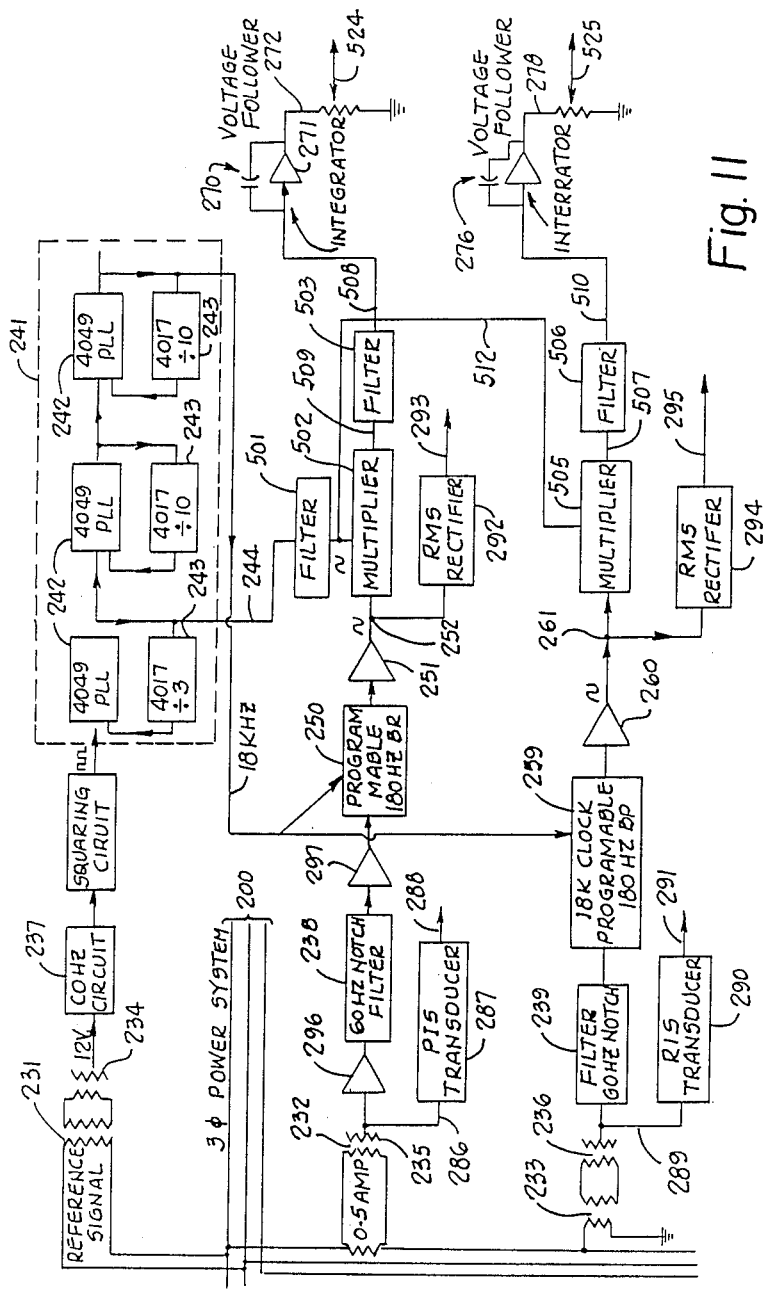
FIGS. 11 and 12 are block diagrams illustrating in detail a further embodiment of the present invention.

FIG. 11 illustrates one such analog circuit embodiment. In this embodiment the phase angle determination circuitry comprises dual input multipliers 502, 505, such as a Burr-Brown MPY -100 multiplier/divider in place of the zero crossing technique of FIGS. 5 and 6.

Other types of multiplying or modulating devices are also suitable including electromechanical devices commonly used in protective relaying, as will be evident from the following description. The multiplier inputs consist of the 180 Hz signal, 244, from the tracking oscillator 241, suitably filtered in filter component 501 to provide a signal 512 stripped of any undesired frequencies. The 180 Hz signals 252, 261 contain respectively the desired current signal information and the voltage signal information. The dc component of the multiplier output signals 507, 509, from these multipliers contain the desired phase angle information, and a double frequency ac component which is removed in the filters 503 and 506. This dc is also proportional to the ac signal magnitude and this fact must be treated. This is done in the filters, 503, 506 by rectifying the ac component of this signal and dividing it into the multiplier dc output signal.

The result is a signal proportional only to the cosine of the phase difference between the two input signals and which appears at the output of the filters as signals 508 and 510 for the current and voltage signal processing respectively.

Signals 508 and 510 are smoothed in 270 and 276 to remove any undesired noise, and isolated from the following A/D converter in 271 and 277, and suitably scaled in 272 and 278 to yield signals 524 and 525 which are processed as previously described in the digital section, FIG. 6. Since these signals represent the cosines of the angle and not the angles proper, as was derived in the embodiment of FIG. 5, the digital processing must be modified to utilize the information in this form.

The trigonometric equations for this solution are:

$$A^*\sin(x)^*B^*\sin(y) = [\cos(x-y) - \cos(x+y)]^*A^*B/2.$$

When $x = y$, and, a, is the phase angle between the two signals, the expression simplifies to:

$$A^*B^*\sin(x+a)^*\sin(y) = [\cos(a) - \cos 2(x+a/2)]^*A^*B/2.$$

The first term right hand side, cos(a), is a dc term proportional to one-half the magnitudes of the input signals and the phase angle between them. The second term represents an ac signal which also has a magnitude proportional to one-half the input signal magnitudes. Thus, in the filter function, this magnitude component hidden in the dc signal is removed to provide output signals 508, 510, representing the cosines of the desired phase angles.

This embodiment does not distinguish between signals in the 2nd and 3rd quadrant because the output cosine function is negative in both of these quadrants. Similarly no distinction is made between the 1st and 4th quadrants. This however, is not a serious limitation in many applications and it can be further minimized by adding a phase shift to either input signal to shift this ambiguity to a noncritical area.

This ambiguity, moreover, can be completely eliminated by observing other relations between the two original signals. One such method is to create two signals out of either the reference signal or the information signal. The extra signal is then processed in the same manner as the initial signals. If this new derived signal is phase shifted by 90° (by conventional means) from the original signal, the resulting new output signal will represent the sine of the phase angle between the original two input signals. One can then construct a table of sine/cosine polarities to identify the specific quadrant of the output phasor.

| QUADRANT TABLE. | | | | |
|---|---|---|---|---|
| Polarity of sine term. | + | + | − | − |
| Polarity of cosine term. | + | − | − | + |
| Quadrant of output phasor. | 1 | 2 | 3 | 4 |

This information can be easily processed in the digital section.

Figure 12:
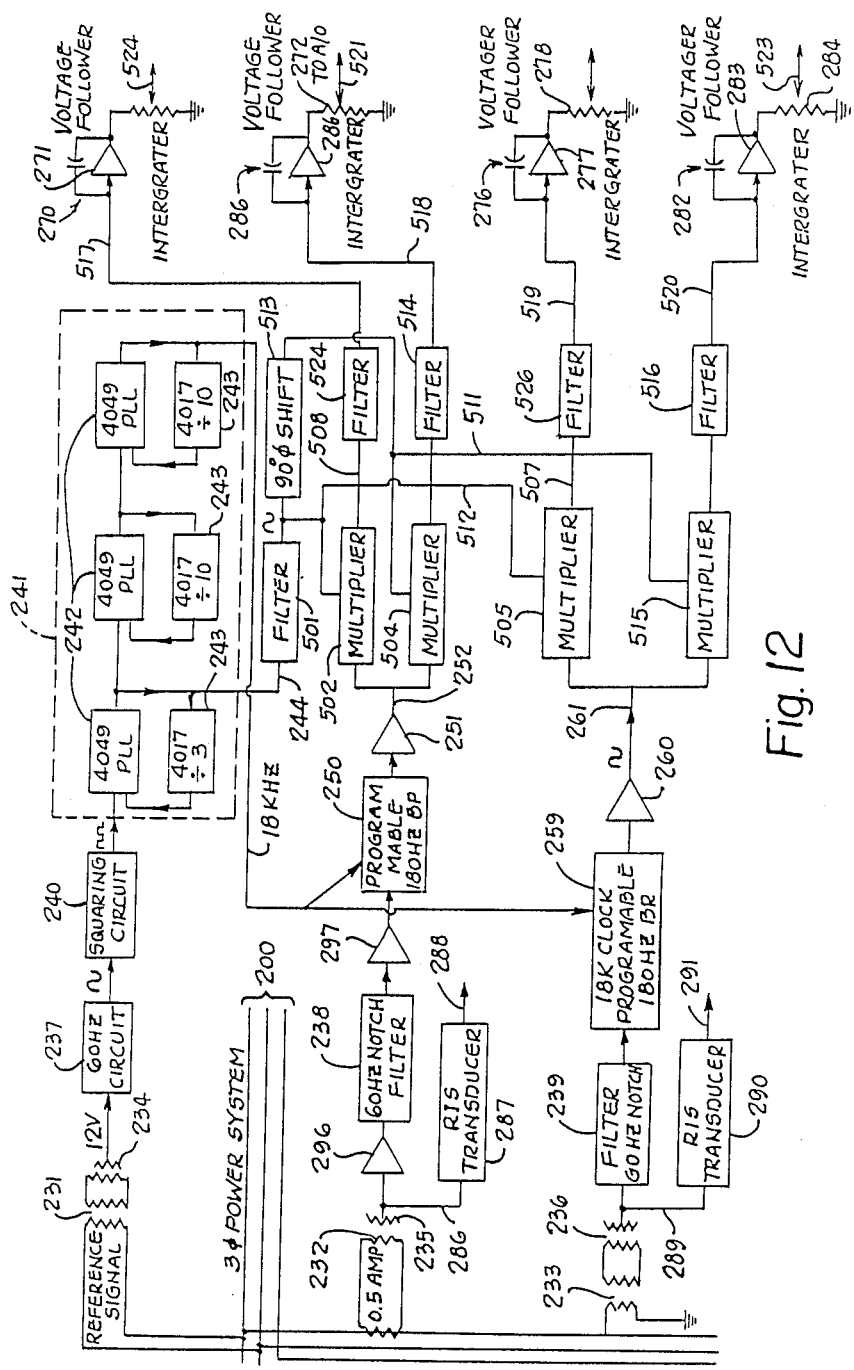

The use of a sine and cosine function can lead to a further simplification in the signal processing. FIG. 12 illustrates one such simplification. In this illustration the phase shift is developed in 513 by shifting the reference 180 Hz signal 512 by 90° to yield new signal 511. Phase shifting this constant magnitude signal is preferred over shifting the variable magnitude information signal because it minimizes the possibility of signal degradation in the phase shifting circuitry. This new reference signal is processed together with the information signal in multipliers 502 and 504 (and 505 and 515 for the voltage signal), in the same manner as described for FIG. 11, except the dc component in the multiplier output need not be scaled to the ac signal magnitudes in the filter 514 and 524 (and 516 and 526 for the voltage signal). The result is dc output signals 517, 518 (for the current signal) and 519, 520 (for the voltage signal). These contain the dc component due to the phase difference and the dc component due to the magnitudes of the ac signals which resulted from the multiplication. In this embodiment, by maintaining the reference signal at a constant magnitude, it is not necessary to segregate these two pieces of information contained in each signal. This constant magnitude can be treated in the scaling functions of 521, 522, 523 and 524.

Figure 13:
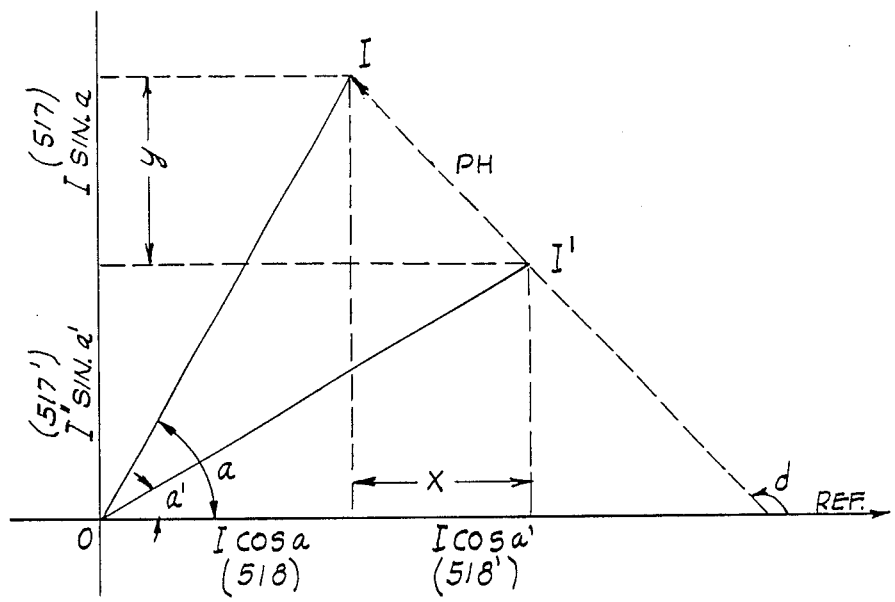
FIG. 13 is a graphical illustration of a principal of operation of the present inventions.

FIG. 13, shows how conventional analytical geometry can directly yield the true phasor values of the change in the input signal due to a power system abnormality. (In FIG. 13 the primes (') represent the ambient conditions and the unmarked symbols the condition during the abnormality). The magnitude of the desired phasor, change, PH, is then derived by first determining the change in the respective sine and cosine terms, and then taking the square root of the sum of the squares of these terms:

$$PH \text{ (magnitude)} = \{[I\sin(a) - I'\sin(a')]^2 + [I\cos(a) - I'\cos(a')]^2\}^{\frac{1}{2}}.$$

The phase angle of this phasor change, d, is given by:

$$d = \tan^{-1}[I\sin(a) - I'\sin(a')]/[I\cos(a) - I'\cos(a')].$$

Note that each term is the product of a magnitude and a sine or cosine term. Thus it is not necessary to separate out these two quantities to arrive at the desired phasor solution. The ambiguity in quadrants can be resolved as described above for FIG. 11, or by other means. The phasor change of the voltage signal can be processed in the same manner, and utilized as described in other embodiments.

Figure 14:
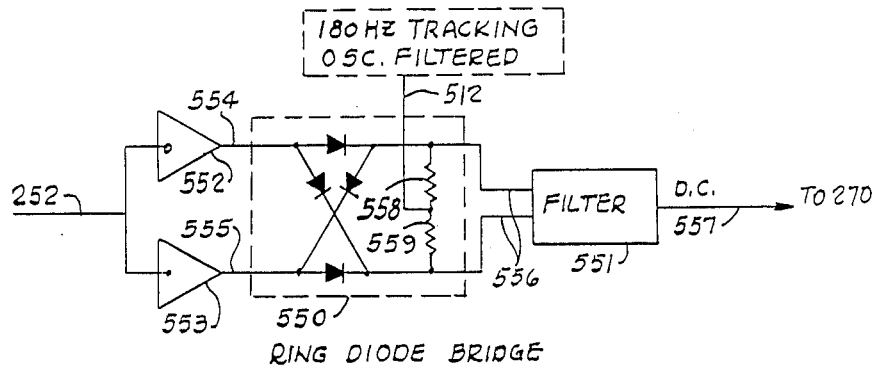
FIGS. 14 and 15 are schematic representations of a portion of the circuitry shown in block form in FIGS. 11 and 12.

Diodes can be used in their nonlinear mode or in a switching mode in circuits which provide the desired phase angle information. FIG. 14 shows one such circuit which also effectively treats the dynamic range problem. In this ring diode bridge the dynamic range problem solution is to drive the phase detector 550 into saturation even at minimum signal level. The result is an output 557 proportional to the phase angle of the signal to the reference, and independent of the signal magnitude.

This is one illustration of the use of a diode circuit in place of the zero crossing technique of FIG. 5. In this embodiment the filtered harmonic signal 252 is amplified in push-pull amplifiers 552 and 553 and applied to the ring diode bridge, 550. The 180 Hz signal, 512 from the tracking oscillator, after filtering, is applied to the diodes through a pair of equal resistors 558 and 559. The output of the diodes, 556 is stripped of any ac in filter 551 to yield a dc output voltage, 557 proportional to the phase angle between the harmonic signal and the tracking oscillator. Since the dc output signal is a function of the cosine of the phase angle and not of the angle itself, the ensuing digital processing program must be modified to utilize this form of information.

Figure 15:
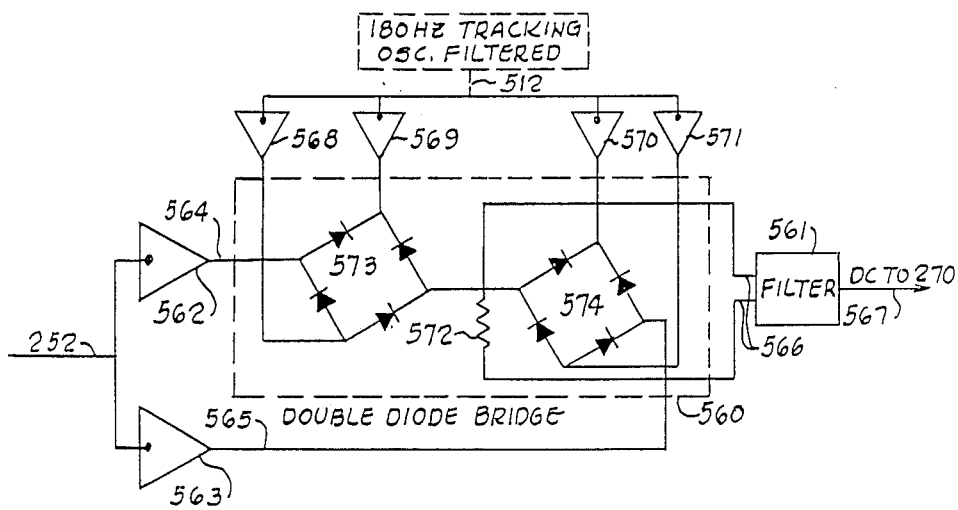

Another applicable form of diode phase detector consists of two diode bridges 573 and 574 as shown in FIG. 15. When the reference signal 512 is larger than the maximum of the input signal 564, 565, this circuit provides a wide linear dynamic range to yield a dc output signal 567 (after filtering) proportional to the magnitude of the ac signal times the cosine of the phase angle with respect to the reference signal. It is not necessary to separate the magnitude and phase information in this dc signal to arrive at the desired change in phasor value when the principle of FIG. 13 is applied.

In all of these multiplying techniques, the resulting dc component is not affected by other extraneous frequencies which may occur in only one of the input signals and not in the other. This fact can be used in two ways: (1) If the information signal is filtered of all harmonics and extraneous frequencies, the reference signal from the tracking oscillator can be left unfiltered. (2) If the tracking oscillator is filtered so it is a clean sine wave, the information signal filtering can be minimized and only need be sufficient to prevent overloads in the signal processing function.

The described diode phase sensitive circuits are frequently used in protective relay designs in configurations in which more than one ac signal is applied to a given input. This can result in outputs which are a function of complex relations among the several input quantities. The various standard characteristics of distance relays are developed in this manner and it is within the intent of this disclosure to include such conventional protective relay configurations within the meaning of determining a quotient of, or comparing a harmonic phasor voltage to a harmonic current phasor.

Other simplifications in the analog functions possible. Filtering functions can be combined, the tracking oscillator function can be performed in other manners, anti-aliasing filters can simplify the requirements on digital filtering and make it feasible to perform all of the signal processing on a digital basis.

Each of the respective functions described in any of the embodiments can be performed by analog means or digital means to determine the desired phasor change information, once the signal is suitably isolated from the high voltage power system.

In connection with utilization of the embodiments described herein, it is to be understood that these embodiments can be used not only to provide warning or indication of the existence of a fault, but also to actuate circuitry and/or mechanism for correcting the fault or removing power from the affected network or portion of the network.

It is to be understood that the description of the preferred embodiment set forth above is intended as illustrative, rather than exhaustive, of the invention. It is to be further understood that those of ordinary skill in the relevant art may make certain deletions from, or additions or modifications (including use of electromechanical equivalents) to the specific detail of the foregoing disclosure without departing from the spirit or the scope of the invention, as set forth in the appended claims.

We claim:

1. A fault analyzer system for an electric power network, for detecting high impedance abnormalities in said network by detecting a phasor signature of such abnormality distinct from other sources of network disturbance, said system comprising:
    (a) means for producing a first reference signal representing substantially instantaneous power network voltage at a point in the network;
    (b) means for producing a second signal representing a substantially instantaneous power network current;
    (c) means for producing a third signal representing substantially instantaneous power network voltage at a point near the point of current signal measurement;
    (d) means for filtering and processing said first, second and third signals to produce signals representing the phasor values of a harmonic component in said second and third signals with respect to a fundamental component of said reference first signal, irrespective of nominal changes in electric power network frequency and minimizing ambiguity due to harmonic frequency difference, said filtering means comprising:
        i. means for establishing a second reference signal substantially in quadrature to said first reference signal, and
        ii. means for producing signals representing the product of a harmonic component of said second and said third signal respectively with both said reference signals respectively to produce signals representing the value of said harmonic phasors of said second and third signals respectively in rectangular coordinate form;
    (e) means for averaging said values of said harmonic phasor signals to produce signals representing the ambient values of each;
    (f) means for determining change in ambient value of each of said harmonic phasor signals;
    (g) means for establishing limits of such changes of said harmonic phasor signals in both magnitude and phase relationship with respect to said reference first signal, and
    (h) means for determining when said changes in said harmonic phasors are not within said limits thereby indicating a high impedance fault type abnormality on the circuit under observation.

2. The system of claim 1 wherein said means for establishing said second quadrature reference signal comprises means for establishing signals in quadrature with respect to said second and third signals respectively and not from said reference first signal.

3. The system of claim 1, wherein:
    said means for processing said phasor values of said harmonics of said second and third signals with respect to said fundamental component of said reference first signal comprises means for measuring the amount of time during each cycle of said harmonic signals in which the polarity of each of said harmonic signals is the same a harmonic of the reference signal.

4. The system of claim 1, further comprising:
    means for self checking the functioning of said system including circuitry for summing said phasor change of said second signal, said phasor change of a third signal and said phasor change of said difference between said second and third signal phasors.

5. The system of claim 1, further comprising:
means responsive to said indicating means for disabling a portion of said network containing said abnormality.

6. A method for detecting an abnormality in a network for distributing ac electrical power at a fundamental frequency, the abnormality contributing to a complex waveform in the network, said method comprising the steps of:
(a) producing a signal representing the fundamental frequency component of a voltage occurring in said network;
(b) analyzing the complex waveform by signal multiplication technique for extracting information from said complex waveform for producing a signal representing directly in rectangular coordinates a phase of a harmonic of a current occurring in the network with respect to the fundamental component of said voltage, said signal production taking place without conversion from another coordinate system;
(c) monitoring said signal indicating said harmonic current phase with respect to the fundamental voltage signal;
(d) producing an indication in response to the occurrence of a predetermined amount of change of said harmonic current phase with respect to said fundamental voltage signal.

7. A method for determining an abnormality in a network for distributing ac electric power at a fundamental frequency, the abnormality contributing to a complex waveform in the network, said method comprising the steps of:
(a) extracting information from said complex waveform for measuring a harmonic current of said network and measuring directly in rectangular coordinates a phase component of said harmonic current, relative to that of a fundamental frequency voltage reference, and
(b) producing an indication in response to a predetermined change of said phase.

8. The method of claim 7, wherein said measurement comprises measuring the phasor value of said harmonic current by:
(a) simultaneously measuring both the magnitude and phase of said harmonic;
(b) producing an indication in response to a predetermined change of said phasor.

9. A system for detecting an abnormality in a network for distributing ac electrical power at a fundamental frequency, the abnormality contributing to a complex waveform in said network, said system comprising:
(a) means for producing a signal representing a phase relation of a harmonic of a voltage occurring in the network by analysis of said complex waveform, said signal being produced directly in rectangular coordinates without conversion from any other coordinate system;
(b) means for producing a signal representing a phase of a harmonic of a current occurring in the network by rectangular coordinate analysis and without conversion from any other coordinate system;
(c) means for monitoring change in the relative phases of said harmonic current signal with respect to said harmonic voltage signal, and (d) means for producing an indication in response to the occurrence of a predetermined amount of said change.

10. A system for detecting an abnormality in a network for distributing ac electrical power at a fundamental frequency, said system comprising:
(a) means for producing a signal representing the fundamental frequency component of a voltage occurring in said network;
(b) means for producing a signal, without prior coordinate system conversion, representing in rectangular coordinates a phase of a harmonic of a current occurring in said network;
(c) means for monitoring said signal representing said harmonic with respect to the fundamental voltage signal; and
(d) means for producing an indication in response to the occurrence of a predetermined amount of change of said harmonic current phase with respect to said fundamental voltage signal.

11. The system of claim 10, wherein said means for producing said signal representing said phase of said harmonic current comprises diode bridge circuitry.

12. The system of claim 10, wherein said means for producing said indication of said change of said harmonic current comprises means for producing a representation of a trigonometric function of the phase angle of said phase and circuitry for producing a signal representing the product of a magnitude of said harmonic current and said trigonometric function.

13. A system for detecting an abnormality in a network for distributing ac electrical power at a fundamental frequency, said system comprising:
(a) means for producing, without prior coordinate system conversion, a signal representing a phasor of a harmonic of a voltage occurring in the network by analysis in rectangular coordinates;
(b) means for producing a signal representing a phasor of a harmonic of a current occurring in the network by rectangular coordinate analysis;
(c) means for monitoring change in the relative phasors of said harmonic current signal with respect to said harmonic voltage signal, and
(d) means for producing an indication in response to the occurrence of a predetermined amount of said change.

14. A system for detecting an abnormality in a network for distributing ac electrical power at a fundamental frequency, said system comprising:
(a) means for producing a signal representing the fundamental frequency component of a voltage occurring in said network;
(b) means comprising diode bridge circuitry for producing a signal representing in rectangular coordinates a phase of a harmonic of a current occurring in said network;
(c) means for monitoring said signal indicating said harmonic phase with respect to the fundamental voltage signal, and
(d) means for producing an indication in response to the occurrence of a predetermined amount of change of said harmonic current phase with respect to said fundamental voltage signal.

15. A system for detecting an abnormality in a network for distributing ac electrical power at a fundamental frequency, said system comprising:

(a) means for producing a signal representing the fundamental frequency component of a voltage occurring in said network;

(b) means for producing a signal representing in rectangular coordinates a phase of a harmonic of a current occurring in said network, said last mentioned means comprising means for producing a representation of a trigonometric function of the phase angle of said phase and circuitry for producing a signal representing the product of a magnitude of said harmonic current and said trigonometric function;

(c) means for monitoring said signal indicating said harmonic phase with respect to the fundamental voltage signal, and (d) means for producing an indication in response to the occurrence of a predetermined amount of change of said harmonic current phase with respect to said fundamental voltage signal.

16. A fault analyzer system for an electric power network for detecting high impedance abnormalities in said network by detecting a phasor signature of such abnormality distinct from other sources of network disturbance, said system comprising:

(a) means for producing a first reference signal representing substantially instantaneous voltage at a point in the network;

(b) means for producing a second signal representing a substantially instantaneous current at a second point in said network;

(c) means for producing a third signal representing substantially instantaneous voltage at a third point near said second point;

(d) means for producing signals representing a harmonic component of said second and third signals and for producing a signal representing a harmonic of said first signal;

(e) means for filtering and processing said first, second and third signals to produce signals representing the phasor values of said harmonic component of said second and third signals with respect to a fundamental component of said reference first signal, irrespective of nominal changes in electric power network frequency and minimizing ambiguity due to harmonic frequency difference, said filtering means comprising:

(i) means for establishing a second reference signal substantially in quadrature to said first reference signal, and (ii) means for producing signals representing the product of said harmonic component of said second and third signal respectively with both said reference signals respectively to produce signals representing the value of said harmonic phasors of said second and third signals respectively in rectangular coordinate form;

(f) means for averaging said values of said harmonic phasor signals to produce signals representing the ambient values of each;

(g) means for determining change in ambient value of each of said harmonic phasor signals;

(h) means for establishing limits of such changes of said harmonic phasor signals in both magnitude and phase relationship with respect to said reference first signal, and (i) means for determining when said changes in said harmonic phasors are not within said limits thereby indicating a high impedance fault type abnormality on the network under observation.

17. A system for detecting an abnormality in a network for distributing AC electrical power at a fundamental frequency, said system comprising:

(a) means for producing a signal representing the fundamental frequency component of a voltage occurring in said network;

(b) means for producing a signal representing in rectangular coordinates a phasor of a harmonic of current occurring in said network, said last mentioned means comprising means for producing a signal representing the product of a magnitude of said harmonic current and a trigonometric function of the phase angle of said phasor with respect to said fundamental component of said voltage;

(c) means for monitoring said signal representing said harmonic phasor with respect to the fundamental voltage signal, and (d) means for producing an indication in response to the occurrence of a predetermined amount of change of said harmonic current phasor with respect to said fundamental voltage signal.

18. A fault analyzer system for an electric power network, for detecting high impedance abnormalities in said network by detecting a phasor signature of such abnormality distinct from other sources of network disturbance, said system comprising:

(a) means for producing a first reference signal representing substantially instantaneous power network voltage at a point in the system;

(b) means for producing a second signal representing a substantially instantaneous power network current;

(c) means for producing a third signal representing substantially instantaneous power network voltage at a point near the point of current signal measurement;

(d) means for processing said first, second and third signals to produce signals representing the phasor values of a harmonic component in said second and third signals with respect to a fundamental component of said reference first signal, irrespective of nominal changes in electric power frequency and minimizing ambiguity due to harmonic frequency difference, said processing means comprising:

(i) means for establishing a second reference signal substantially in quadrature to said first reference signal;

(ii) means for producing signals representing a harmonic component of said second and third signals and means for creating a harmonic of said first reference signal, and (iii) means for producing signals representing the product of a harmonic component of said second and third signals respectively with both said reference signals respectively to produce signals representing the value of said harmonic phasors of said second and third signals respectively in rectangular coordinate form;

(e) means for averaging said values of said harmonic phasor signals to produce signals representing the ambient values of each;

(f) means for determining change in ambient value of each of said harmonic phasor signals;

(g) means for establishing limits of such changes of said harmonic phasor signals in both magnitude and phase relationship with respect to said reference first signal, and (h) means for determining when said changes in said harmonic phasors are not within said limits thereby indicating a high impedance fault type abnormality on the network under observation.

19. The system of claim 18, wherein said means for establishing said second quadrature reference signal comprises means for establishing quadrature signals with respect to said second and said third signals.

20. The system of claim 18, further comprising
(a) means for establishing a harmonic of the first reference signal, and
(b) said means for processing said phasor values of said harmonic of said second and third signals with respect to said fundamental component of said reference first signal comprises means for measuring the amount of time during each cycle of said harmonic signals in which the polarity of each of said harmonic signals is the same as that of a harmonic of the reference first signal.

21. A method for detecting an abnormality in a network for distributing ac electrical power at a fundamental frequency, the abnormality contributing to a complex waveform in the network, said method comprising the steps of:
(a) producing a signal representing the fundamental frequency component of a voltage occurring in said network;
(b) analyzing the complex waveform by signal multiplication technique for extracting information from said complex waveform for producing a signal representing directly in rectangular coordinates a phasor of a harmonic of a current occurring in the network with respect to the fundamental component of said voltage, said signal production taking place without conversion from another coordinate system;
(c) monitoring said signal indicating said harmonic current phasor with respect to the fundamental voltage signal;
(d) producing an indication in response to the occurrence of a predetermined amount of change of said harmonic current phasor with respect to said fundamental voltage signal.

22. A method for determining an abnormality in a network for distributing ac electrical power at a fundamental frequency, the abnormality contributing to a complex waveform in the network, said method comprising the steps of:

(a) extracting information from said complex waveform for measuring a harmonic current of said network and measuring directly in rectangular coordinates a phasor of said harmonic current, relative to that of a fundamental frequency voltage reference, said measuring step comprising measuring the phasor value of said harmonic current by:
   (i) simultaneously measuring both the magnitude and phase of said harmonic, and
(b) producing an indication in response to a predetermined change of said phasor.

23. A system for detecting an abnormality in a network for distributing ac electrical power at a fundamental frequency, the abnormality contributing to a complex waveform in said network, said system comprising:
(a) means for producing a signal representing a phasor of a harmonic of a voltage occurring in the network by analysis of said complex waveform, said analysis including measurement of said phasor, said measurement being produced directly in rectangular coordinates without conversion from any other coordinate system;
(b) means for producing a signal representing a phasor of a harmonic of a current occurring in the network by rectangular coordinate analysis and without conversion from any other coordinate system;
(c) means for monitoring change in the relative phases of said harmonic current signal with respect to said harmonic voltage signal, and
(d) means for producing an indication in response to the occurrence of a predetermined amount of said change.

24. A system for detecting an abnormality in a network for distributing ac electrical power at a fundamental frequency, said system comprising:
(a) means for producing a signal representing the fundamental frequency component of a voltage occurring in said network;
(b) means for producing a signal, directly and without prior coordinate system conversion, representing in rectangular coordinates a phasor of a harmonic of a current occurring in said network;
(c) means for monitoring said signal indicating said harmonic with respect to the fundamental voltage signal, and
(d) means for producing an indication in response to the occurrence of a predetermined amount of change of said harmonic current phasor with respect to said fundamental voltage signal.

* * * * *